United States Patent
Boutobza et al.

(10) Patent No.: US 11,036,907 B2
(45) Date of Patent: Jun. 15, 2021

(54) AUTOMATIC TESTBENCH GENERATOR FOR TEST-PATTERN VALIDATION

(71) Applicant: Synopsys, Inc., Mountain View, CA (US)

(72) Inventors: Slimane Boutobza, Grenoble (FR); Andrea Costa, Le Touvet (FR); Sorin Ioan Popa, Saint Ismier (FR)

(73) Assignee: SYNOPSYS, INC., Mountain View, CA (US)

( * ) Notice: Subject to any disclaimer, the term of this patent is extended or adjusted under 35 U.S.C. 154(b) by 0 days.

(21) Appl. No.: 16/806,929

(22) Filed: Mar. 2, 2020

(65) Prior Publication Data
US 2020/0279064 A1 Sep. 3, 2020

(30) Foreign Application Priority Data
Mar. 1, 2019 (EP) .................................. 19305244

(51) Int. Cl.
*G06F 30/30* (2020.01)
*G01R 31/00* (2006.01)
(Continued)

(52) U.S. Cl.
CPC ....... *G06F 30/3308* (2020.01); *G01R 31/317* (2013.01); *G01R 31/318307* (2013.01);
(Continued)

(58) Field of Classification Search
None
See application file for complete search history.

(56) References Cited

U.S. PATENT DOCUMENTS

| 4,667,290 A | 5/1987 | Goss et al. |
| 6,205,407 B1 | 3/2001 | Testa et al. |
| 7,178,115 B2 * | 2/2007 | Rajsuman ............... G06F 30/33 716/136 |

FOREIGN PATENT DOCUMENTS

| CN | 109254776 A | 1/2019 |
| EP | 0371944 A2 | 6/1990 |

OTHER PUBLICATIONS

Oomman et al., "A Universal Technique for Accelerating Simulation of Scan Test Patterns," Int'l Test Conference, 1996 IEEE, Paper 6.1, pp. 135-141. (Year: 1996).*

(Continued)

*Primary Examiner* — Leigh M Garbowski
(74) *Attorney, Agent, or Firm* — Sterne, Kessler, Golstein & Fox P.L.L.C.

(57) ABSTRACT

Disclosed herein are computer-implemented method, system, and computer-program product (non-transitory computer-readable storage medium) embodiments for automatic test-pattern generation (ATPG) validation. An embodiment includes parsing an ATPG input, semantically analyzing the ATPG input, generating a first HDL model based on the semantic analysis, creating an HDL testbench based on the first HDL model, simulating an ATE test of a circuit structure, and outputting a validation result of the circuit structure, based on the simulating. In some embodiments, the parsing may include lexical and/or syntactic analysis. The HDL model may represent the circuit structure as functionally equivalent to the ATPG input, as determined based on the semantic analysis. In some embodiments, the ATPG input includes a cycle-based test pattern for a first block of the ATPG input, and the HDL testbench includes event-based test patterns that mimic given ATE behavior. The HDL model may be smaller in size than the ATPG input.

20 Claims, 18 Drawing Sheets

(51) Int. Cl.
  *G06F 30/3308* (2020.01)
  *G06F 30/333* (2020.01)
  *G01R 31/317* (2006.01)
  *G01R 31/3183* (2006.01)

(52) U.S. Cl.
  CPC .... *G06F 30/333* (2020.01); *G01R 31/318357* (2013.01); *G01R 31/318364* (2013.01)

(56) References Cited

OTHER PUBLICATIONS

Maston, "Structuring STIL for Incremental Test Development," Int'l Test Conference, 1997 IEEE, Paper 40.1, pp. 1004-1010. (Year: 1997).*

Parnas, "Doing it in STIL: Intelligent Conversion from STIL to an ATE Format," ITC Int'l Test Conference, 2000 IEEE, Paper 3.2, pp. 64-71. (Year: 2000).*

Wohl et al., "Optimizing the Flattened Test-Generation Model for Very Large Designs," ITC Int'l Test Conference, 2000 IEEE, Paper 26.1, pp. 681-690. (Year: 2000).*

Maston, "Considerations for STIL Data Application," ITC Int'l Test Conference, 2002 IEEE, Paper 10.3, pp. 290-296. (Year: 2002).*

Raghuraman, "Simulation Requirements for Vectors in ATE Formats," ITC Int'l Test Conference, 2004 IEEE, Paper 38.3, pp. 1100-1107. (Year: 2004).*

Dowding et al., "Extending STIL 1450 Standard for Test Program Flow," ITC Int'l Test Conference, 2004 IEEE, Paper 14.3, pp. 423-431. (Year: 2004).*

Maston et al., "Layering of the STIL Extensions," Int'l Test Conference, 2005 IEEE, Paper 23.3, pp. 1-8. (Year: 2005).*

Maston et al., "STIL Persistence" Int'l Test Conference, 2005 IEEE, Paper 41.2, pp. 1-6. (Year: 2005).*

Boutobza et al., "A Journey from STIL to Verilog," 2018 IEEE East-West Design & Test Symposium (EWDTS), Sep. 14-17, 2018 European Union, pp. 1-11. (Year: 2018).*

Boutobza et al., "An Automatic Testbench Generator for Test Patterns Validation," 2018 IEEE East-West Design & Test Symposium (EWDTS), Sep. 14-17, 2018 European Union, pp. 1-11. (Year: 2018).*

Soin et al., Pattern Translation Tool for Post-Silicon ASCI Testing, 2018 Int'l Conference on Computing, Power and Communication Technologies (GUCON), 2018 IEEE, pp. 170-174 (Year: 2018).*

"IEEE Standard Hardware Design Language Based on the Verilog Hardware Description Language," IEEE Standard 1364-1995, rev. 1996 (1996).

"Standard Test Interface Language (STIL) for Digital Test Vectors," IEEE Standard 1450-1999, Aug. 1999, rev. 2011 (2011).

Stanley, K., "High-Accuracy Flush-and-Scan Software Diagnostic," IEEE Design and Test of Computers, Nov. 2001, pp. 56-62 (2001).

Raghuraman, R., "Simulation requirements for vectors in ATE formats," ITC 2004, pp. 1100-1107 (2004).

Spear, C., *System Verilog for Verification: A Guide to Learning the Testbench*, Language Features, Chapter 1, (2006).

*VectorPort Users Manual*, Test Spectrum, Inc., rev. 6.3 (2010).

Kajihara, S., et al., "On Test Pattern Compaction with Multi-Cycle and Multi-Observation Scan Test," 10th International Symposium on Communications and Information Technologies, pp. 723-726 (2010).

Kuehlmann, A., et al., "Equivalence Checking," Chapter 4 in *Electronic Design Automation for IC Implementation, Circuit Design, and Process Technology*, (Lavagno et al., eds.), pp. 77-108 (2016).

"Language Overview Waveform Generation," Test Systems Strategies Inc., ver. R2017.0 (2017).

"Test Pattern Validation User Guide," Synopsys, Inc., Version N-2017.09-SP2 (Mar. 2018).

"Design Compiler User Guide," Synopsys, Inc., Version N-2017.09 (Sep. 2017).

"Star Memory System (SMS) Quick Start Guide," Synopsys, Inc., Version 2.0 (Mar. 2018).

"TestMAX DFT Boundary Scan User Guide," Synopsys, Inc., Version Q-2019.12 (Dec. 2019).

Agnesina, A., et al., "Reducing Compilation Effort in Commercial FPGA Emulation Systems Using Machine Learning," IEEE/ACM International Conference on Computer-Aided Design 2019, pp. 1-8 (2019).

Lam, W.K., *Hardware Design Verification: Simulation and Formal Method-Based Approaches*, ch. 4, p. 137-209 (2005).

"TetraMAX ATPG and TetraMAX II ADV ATPG User Guide," Synopsys, Inc., Version N-2017.09-SP4 (Mar. 2018).

"IEEE Standard for Extensions to Standard Test Interface Language (STIL) (IEEE Std. 1450-1999) for DC Level Specification," IEEE Standard 1450.2-2002 (Mar. 18, 2003).

* cited by examiner

```
PatternBurst "BurstA" {PatList { Pat2; Pat3}}
PatternBurst "BurstB" {PatList { BurstA; Pat4}}
PatternBurst "BurstC" {PatList { Pat1; BurstB}} always begin: TestScheduler---
    @ (start_test) #(D[1]) → pat1_start;
    @ (pat1_end) #(D[2]) → pat2_start;
    @ (pat2_end) #(D[3]) → pat3_start;
```

FIG. 6

```
maxtb> Checking for feature license
maxtb> Parsing STIL file "patterns.stil"
maxtb> STIL file successfully interpreted (PatternExec. "")
maxtb> Total test patterns to process 12
maxtb> Detected a 3X Serializer mode (xtol, update, pipeline 3/3)
maxtb> PSD (Parallel Strobe Data) file "maxtb_0_psd.dat" generated
maxtb> Test data file "maxtb_0.dat" generated
...
maxtb> Test bench file "maxtb.v" generated
maxtb> Test data file mapping
        patterns.stil → maxtb_0.dat (patterns from 0 to 2, partition: part0)
        patterns.stil → maxtb_1.dat (patterns from 3 to 5, partition: part1)
        patterns.stil → maxtb_2.dat (patterns from 6 to 8, partition: part2)
        patterns.stil → maxtb_3.dat (patterns from 9 to 11, partition: part3)
maxtb> Memory usage: 8.73 Mbytes. CPU usage: 0.074 seconds
maxtb> End
```

FIG. 11

```
##################################
Test Protocol File generated from original file "patterns.stil"
STIL file version: 1.0
Enhanced Runtime Version: use <sim_exec> +max_help for options
##################################
XTB: Reading partition 0 (test data file maxtb_0.dat)
XTB: Enabling Enhanced Debug Mode
XTB: Starting parallel simulation of 3 patterns
XTB: Using 1 serial shifts
XTB: Starting macro test_setup.....  T=0.00 ns, V=1
XTB: Starting proc load_unload......  T=200.00 ns, V=3
XTB: Begin parallel scan load for pattern 0 (T=200.00 ns, V=3)
XTB: (parallel) shift, at 300.00 ns
XTB: Starting proc multiclock_capture..., T=4300.00 ns, V=44
...
XTB: Begin parallel scan load for pattern 2 (T=8600.00 ns, V=87)
XTB: (parallel) shift, at 8700.00 ns
>>> Error during scan pattern 2 (detected from unload of pattern 1)
>>>      At T=8740.00 ns, V=102, exp=1, got=0, pin test_so2, scan cell 4
>>> Error during scan pattern 2 (detected from unload of pattern 1)
>>>      At T=8740.00 ns, V=101, exp=1, got=0, pin test_so3, scan cell 4
>>>      At T=8740.00 ns, V=102, exp=0, got=1, pin test_so3, scan cell 4
XTB: searching corresponding parallel strobe failures...
>>>      At T=8740.00 ns, V=93, exp=0, got=1, chain 2, scan cell 4, cell name ctl.ctl_de_reg_5
XTB: Starting proc multiclock_capture...., T=12700.00 n, V=128
XTB: Simulation of 3 patterns completed with 3 mismatches (1 internal mismatch) (time 12800.00 ns, cycles: 128)
```

FIG. 12

AUTOMATIC TESTBENCH GENERATOR FOR TEST-PATTERN VALIDATION

CROSS-REFERENCE TO RELATED APPLICATIONS

The present application claims priority under 35 U.S.C. § 119(a)-(d) to European Patent Application No. EP19305244 titled "An Automatic Testbench Generator for Test Patterns Validation," filed Mar. 1, 2019, which is hereby incorporated by reference in its entirety for all purposes.

COPYRIGHT NOTICE

The assignee of this patent document has no objection to the facsimile reproduction by anyone of the patent document itself, or of the patent application, as it appears in the files of the United States Patent and Trademark Office, but otherwise reserves all rights whatsoever in any included works of authorship protected by copyright.

DISCLAIMERS

In the following Background, Summary, Detailed Description, and paragraph headings do not signify limitations. In these writings, the citation or identification of any publication signifies neither relevance nor status as prior art. Many paragraphs in this disclosure are common to multiple Synopsys patent specifications.

BACKGROUND

Testing semiconductor ICs is a crucial step in the overall fabrication process. Over the years, different techniques aiming to ease test procedure and maximize test quality (test coverage) while trying to reduce test time (thereby reducing test cost) have been developed. The diversity and the complexity of the semiconductor technology are such that no standard optimal test methodology or flow exists. To be efficient, a specialized test solution and flow may need to be derived for each semiconductor technology type (digital, analog, mixed) and domain (memory logic, arithmetic units, etc.). With random logic testing, an accepted approach is to rely on a structural DFT (Design For Test) insertion (allowing to improve controllability and observably of the circuit), followed by an ATPG (Automatic Test-Pattern Generation) test pattern generation (allowing for clear test quality assessment through a succinct fault coverage metric), and finally, tester validation. The communication between the ATPG and the Tester may be based on specific test formats. Nowadays, the "Standard Test Interface Language (STIL) for Digital Test Vectors" IEEE Standard P1450-1999 is a de-facto standard in industry.

In current ATPG flows, the original netlist may undergo a set of transformations to derive their equivalent ATPG models. These transformations may include logic optimization, redundancy elimination, and logic sharing and remodeling as discussed in P. Wohl and J. Waicukauski, "Optimizing the flattened test-generation model for very large designs", ITC, 2000. While such transformations may be required for ATPG to manage increasingly complex circuits, to ease fault population and to speed up test generation, they often induce an opposite effect on "the correctness and confidence" of the generated test patterns. On the other hand, ATPG tools use a zero-delay principle to generate test vectors which may induce a divergent behavior of the Design Under Test (DUT) when compared to the actual full timing simulation. Debugging a failing pattern on the Tester is a tedious and time-consuming task. These are some of the reasons that lead semiconductor companies to recourse to test pattern validation (PatVal). With the emergence of multimillion-gate systems-on-a-chip (SoC) technologies, such processes become more important for validating generated test vectors and to reduce debug cost by allowing an early and flexible debug capability.

Due to the criticality and the importance of test patterns validation for test closure and signoff, there is a need to make sure that it is conducted efficiently, otherwise it may harm the whole test process by adding yet another complex and time-consuming step. As shown in FIG. 1, pattern validation is a step prior to tester validation. Excluding the tester step, it is usually the step that may be consuming the maximum amount of time (from several days to several weeks depending on the design size and the performed simulation mode). Therefore, shortening this step may benefit the overall test process from one hand, and may shorten the Tester time by detecting most if not all bad test patterns, from the other hand. This in turn may reduce the Tester debug to almost its minimum time, that is, most of the failures may be real design or implementation failures that require pattern diagnosis to reveal the root cause of the detected fault (and no longer a pattern debug issue). This final step is typically performed using a diagnosis capability often embedded within the ATPG tool itself. In addition to a minimal impact on the overall test time, PatVal platform should allow for confident and trustworthy validation and ease of debug (in case of detected failures) while ensuring high quality of result (QoR) in terms of runtime and memory consumption. Additionally, ease of use and robustness of the platform may also be important factors to consider.

In spite of its importance, both on the correctness of the test data and the performance impact of the overall test process, test patterns validation domain received little attention from researchers of both academia and industry. Several reasons may explain this. A decade ago, PatVal was not mandatory, and when performed, was not consuming significant validation time, thus no optimization was needed mainly due to smaller DUT sizes. Also, the industry was far from handling complexity of today's test solutions (both on DFT side with new complex test compression architectures, and on the ATPG side, to target newer faults models, like small delay faults, or bridging faults, while pushing to the limit of test-data-volume reduction), which brings greater chances to introduce subtle bugs and derive bad test patterns. On the other hand, the few existing solutions were protected and customized for their companies' specific needs and flows.

Existing solutions fall under two main categories. Historically, pattern validation tools used a programming-language interface (PLI)-based (as discussed in Verilog Programming Language Interface, IEEE Standard 1364-1995) testbench approach. This is the case for many industrial tools, whether provided by EDA companies or those developed in-house by some integrated device manufacturer (IDM) companies. This tool may be packaged under the form of a static library that may need to be compiled and linked with the simulator to get access to a set of PLI functions. Together with a basic Verilog test-bench generated by the ATPG tool, these functions may read in the STIL file, interpret its protocol and apply its test stimulus to the DUT and check the responses against the expected data specified in that STIL file as discussed in R. Raghuraman, "Simulation requirements for vectors in ATE formats", pp. 1100-1107, ITC, 2004 While such an approach has been proven to be efficient for its flexibility, it may suffer from several drawbacks. It may not be easy to debug (several possible culprits: simulator, PLI, STIL interpreter, parser), it may have a significant impact on runtime performance (mainly due to PLI acc_*access functions), its portability over different simulators may be tedious (special dedicated libraries, different PLI versions), and the majority of customers may not be familiar with PLI (nor with STIL). They may prefer a simpler format to manipulate and explore in case of simulation misbehavior.

An alternative approach is provided by the few EDA companies that propose industrial ATPG tools. It may consist of generating the testbench (TB) directly from the ATPG tool itself. However, these solutions may use the ATPG specific internal data-structure that is not the same as the STIL file. Such an approach may exhibit the following weaknesses: On one hand, specific STIL issues related to the final generated STIL may not be captured (no direct STIL to testbench mapping). This may include modeling class issues, that is, constructs that are specific to the STIL which do not exist in a simplified ATPG data structure (e.g., issues in the WFC of the STIL, or an incomplete WFCMAP introduced only at the latest step when generating the STIL). It may also include translating class issues, e.g., a missed inversion in the ScanStructure block, that was not present in the ATPG tool database, but introduced by the STIL generator or a bad cyclization of the ATPG events. And finally, it may include a missed class issue, where some ATPG events are not present in the final STIL file.

On the other hand, assuming an issue free STIL, this flow may not validate the actual STIL targeted for the tester, hence implying a real concern regarding its validation confidence: does a passing testbench (no failure detected) imply a STIL that will also pass on the Tester?

FIG. 1 is a diagram of a test process flow according to some embodiments of the present disclosure.

FIG. 2 illustrates concerns of an ATPG-generated TB, according to some embodiments of the present disclosure. While starting from the same source (internal ATPG datastructure), even with the best intention and efforts, destination 2 (TB file) may not fully cover (validate) destination 1 (STIL file). Paths P1 and P2 are different and issues introduced lately by STILGen block may not be fully covered with TB generator block.

SUMMARY

This Summary is a prelude to the Detailed Description. This Summary, together with the independent Claims, signifies a brief writing about at least one claimed embodiment (which can be a discovery, see 35 U.S.C. § 100(a), (j)), for use in commerce that is enabled by the Specification and Drawings.

The claims signify a brief description of one or more of the embodiments, and/or examples found within this disclosure.

From the preceding background, an automated solution, under the form of an automatic testbench generator tool, may reduce testbench development time and keep up with aggressive time-to-market goals. However, devising an efficient PatVal strategy that respects the above criteria is non-trivial. The correlation between various goals and criteria have typically posed challenges. For example, general, runtime performance improvement and memory saving may be antagonistic. Similarly, acceleration techniques, such as cycle count reduction through parallel access to scan cells, may save test time at the expense of validation confidence.

Such challenges were addressed by devising an original and flexible validation solution. The approach was implemented in a standalone industrial tool that reads in a tester-pattern format (STIL) and produces an HDL based testbench tailored for PatVal problems. Experiments with real designs have shown a clear outperformance of this new tool compared to previous PLI-based tools in terms of both performance and QoR.

Each of the two existing approaches described above has its own drawbacks. To yield further improvements from those existing approaches, a new approach is considered below. First, as a general validation strategy, an SBV (Simulation-Based Validation) approach may be adopted. This approach may prove efficient for accurate (dynamic) validation while allowing for easy debug prospection. This ease of debugging is comparable with existing tools. Second, unlike ATPG-generated TBs, starting from the actual STIL destined for the tester (path P3 in FIG. 2) may efficiently derive the equivalent TB. In this manner, a more direct validation of this STIL, by encompassing all its data and protocol aspects, may be provided. Third, at the flow level, separating the validation process from the ATPG domain, the tester element (validation tool) may reliably and objectively evaluate the behavior of the tested element (ATPG and generated STIL files). The result of these choices is a standalone testbench generator that may read in the actual STIL targeted for the tester and produce its equivalent HDL based TB as depicted in FIG. 3.

This HDL based testbench tool may be permitted to cope with limitations of conventional PLI-based tools, whereas the standalone tool, being separate from the ATPG domain, may overcome limitations of ATPG-generated TB tools. This strategic positioning may significantly improve validation confidence. Having another tool, implemented differently and using a different language (e.g., HDL) to validate a primary tool and its outputs (e.g., based on STIL), may greatly enhance the validation confidence (e.g., the greater the difference, the better in terms of validation confidence). Related considerations are discussed in W. K. Liam, *Hardware Design Verification*, ch. 4, pp. 173. Such positioning, is however, far from being sufficient. In particular, to address the performance aspect while considering the robustness and ease of use, it may be necessary to be followed by an efficient TB architecture. Therefore, at a low level, a possible contribution may be a TB architecture tailored for test pattern validation.

FIG. 3 shows that this architecture may consider the general anatomy of ATPG input and may provide suitable implementation for each part, according to a general principle of PatVal. At a high level as depicted in FIG. 3, it may be composed of two main parts. First, a translator module may transform STIL finto an equivalent HDL (e.g., Verilog) format. Then, the Testbench Architect may take the resulting statements and building blocks and arrange them according to a specific template to derive the final TB.

FIG. 4, shows a translator engine may be used to transform the cycle-based tester format (e.g., STIL) into an event-based HDL format (e.g., Verilog). The resulting TB may be a representation that may mimic the Automatic Test Equipment (ATE) STIL execution in an event-based simulation (logic simulator) with regard to STIL function, behavior, data/information, and timing events. This versatile approach (a—STIL interpretation, b—HDL translation, c—TB building) may allow STIL to be decoupled from the testbench, which in turn may allow design flows to adapt to any given HDL with reduced cost and effort, e.g., adaptation of the last two blocks instead of all blocks, in some embodiments.

This disclosed approach may not be entirely free of challenges. First, steps may be taken to mitigate risks of STIL-to-HDL translation losing necessary information or altering original STIL behavior, for example. This consideration is generally not needed for languages in the same domain, but this must be addressed when using separate domains, such as when starting from a cycle-based tester language to derive and "translate" an event-based HDL with different meanings and abstraction levels. Moreover, some semantic ambiguity of STIL language, as discussed by Greg Maston in "STIL Persistence", paper 41.2, ITC (2005), may lead to more than one single interpretation, which may further complicated the objective. The second set of challenges may be related to the TB itself. Ensuring reasonable runtimes and memory consumption for the ever growing complexity and size of multimillion-gate designs is not a trivial task, and tradeoffs may be needed between antagonistic criteria, satisfying requirements for robustness and validation confidence.

This document focuses on testbench architecture and its automatic generation by providing a detailed presentation along with main experimental results. Aspects related to various simulation scenarios (parallel simulation, runtime vs. compilation time, concurrent pattern validation, generic testbench . . . ), and those related to simulation debug mode are described in Synopsys "TetraMAX Test Pattern Validation User guide" version N-2017.09-SP4, March 2018. Likewise, the principle of STIL to HDL translation is outlined herein, while more details are discussed in S. Boutobza, S. Popa, A. Costa, "A Journey from STIL to Verilog," paper 182, EWDTS 2018.

DRAWINGS

The following Detailed Description, figures, and Claims signify the uses and advantages of the claimed embodiments. All of the figures are used only to provide knowledge and understanding and do not limit the scope of the claimed embodiments and their embodiments. Such figures are not necessarily drawn to scale.

Similar components or features used in the figures can have the same, or similar, reference signs in the form of labels (such as alphanumeric symbols, e.g., reference numerals), and can signify a similar or equivalent use. Further, various components of the same type can be distinguished by following the reference label by a dash and a second label that distinguishes among the similar components. If only the first reference label is used in the Specification, its use applies to any similar component having the same first reference label irrespective of the second reference label. A brief description of the figures is below.

FIG. 6 shows STIL glow and equivalent Verilog scheduler, according to some embodiments of the present disclosure.

FIG. 11 shows a TB generation report, according to some embodiments of the present disclosure.

FIG. 12 shows a TB simulation report, according to some embodiments of the present disclosure.

Figure 15A:
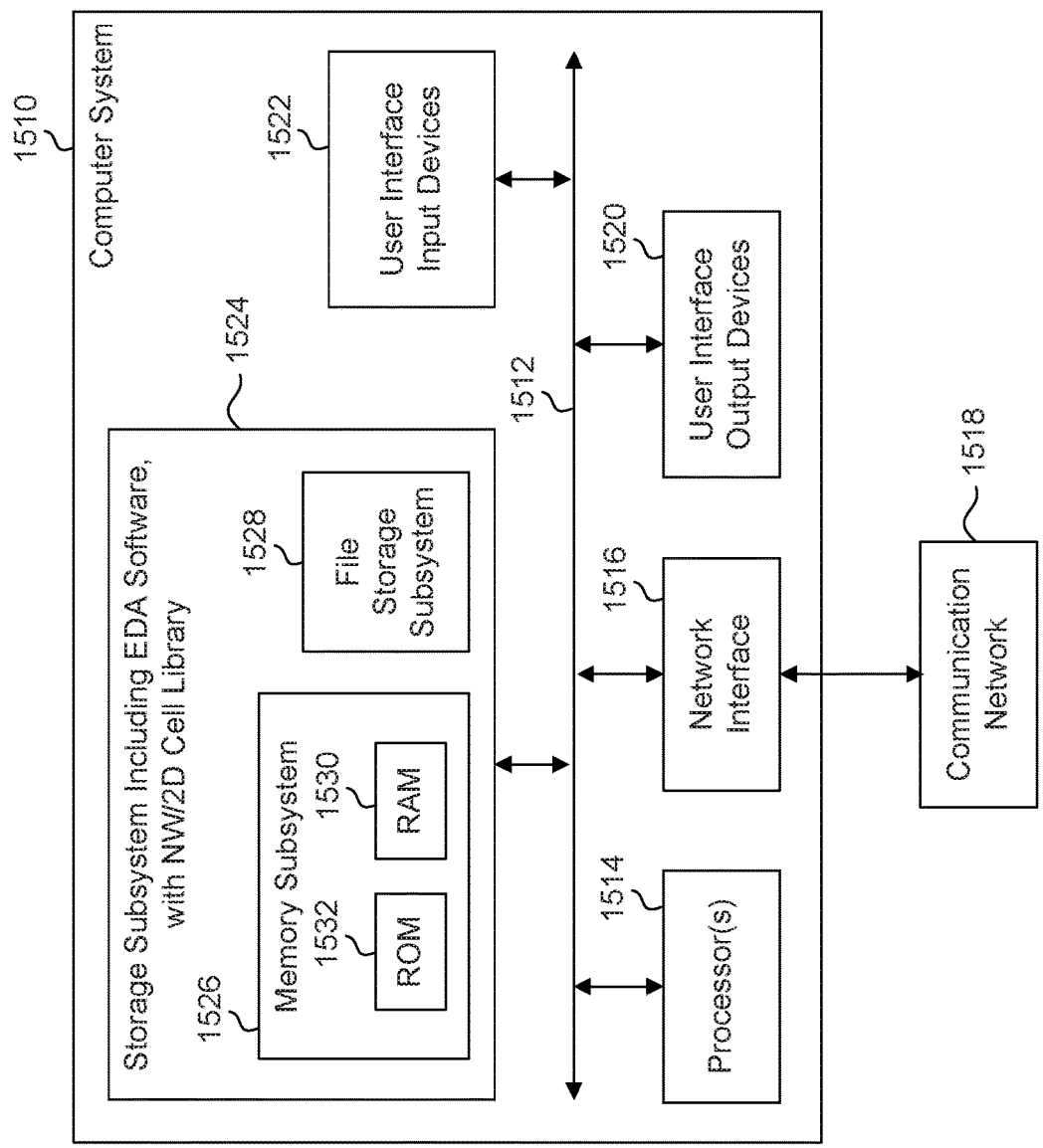
Figure 15C:
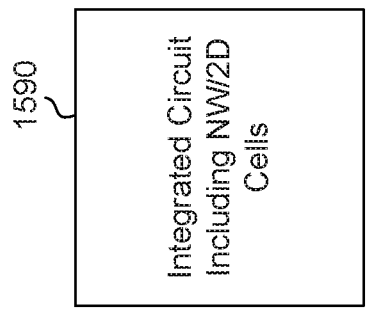
Figure 15B:
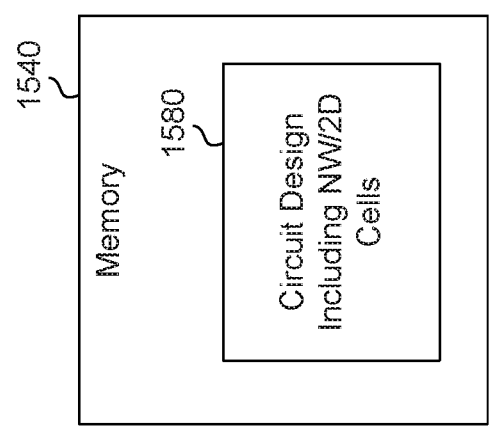

FIGS. 15A, 15B, and 15C illustrate abstract diagrams of a computer system for use in commerce, if needed, by the claimed embodiments, as well as an embodiment of a circuit design and an embodiment of a manufactured circuit that may be used in accordance with the claimed embodiments.

Figure 16:
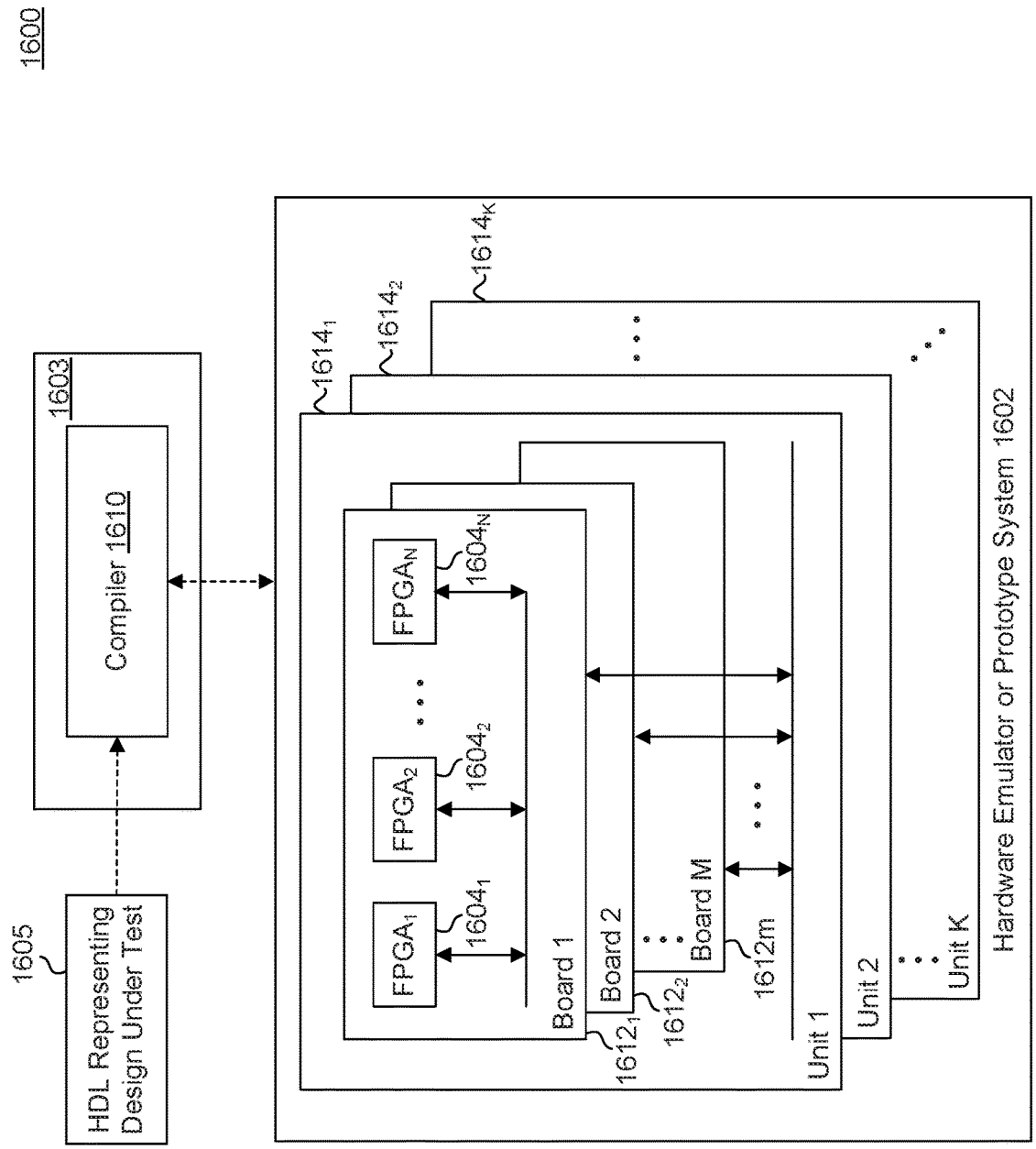

FIG. 16 illustrates a block diagram of an emulation system, according to some embodiments of the present disclosure.

Figure 17:
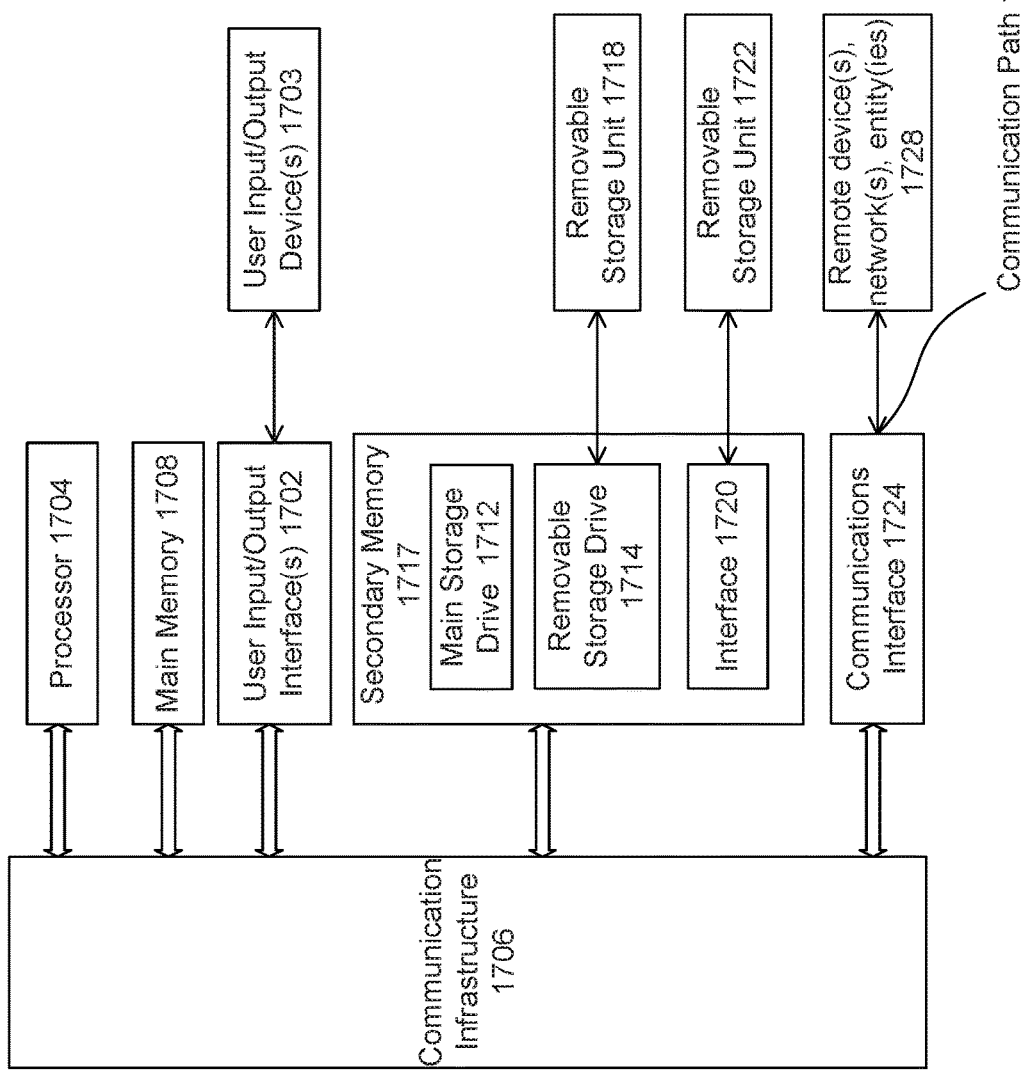

FIG. 17 shows an example computer system, according to some embodiments.

In the figures, reference signs may be omitted as is consistent with accepted engineering practice; however, a skilled person will understand that the illustrated components are readily understood when viewed in context of the illustration as a whole and the accompanying disclosure describing such various figures.

DETAILED DESCRIPTION

The figures and Detailed Description signify, only to provide knowledge and understanding, the claimed embodiments. To minimize the length of the Detailed Description, while various features, structures or characteristics can be described together in a single embodiment, they also can be used in other embodiments without being written about. Variations of any of these elements, and modules, processes, machines, systems, manufactures or compositions disclosed by such embodiments and/or examples are used in commerce. The figures and Detailed Description also can signify, implicitly or explicitly, advantages and improvements of the claimed embodiments and their embodiments for use in commerce.

In the figures and Detailed Description, numerous specific details may be described to enable one or more of the exemplary embodiments and/or examples. In the interest of not obscuring the presentation of the exemplary embodiments and/or examples in the following Detailed Description, some processing steps or operations that are known in the art may be combined together for presentation and for illustration purposes and might not be described in detail. However, a skilled person will recognize that these exemplary embodiments and/or examples may be used in commerce without these specific details or with equivalents thereof. In other instances, well-known processes and devices are not described in detail as not to unnecessarily obscure aspects of these exemplary embodiments and/or examples. In other instances, some processing steps or operations that are known in the art may not be described at all. Instead, the following description is focused on the distinctive features or elements of various exemplary embodiments and/or examples. Furthermore, while this description may refer to some components of the structure as singular, more than one component may be depicted throughout the figures and like components are labeled with like numerals.

The growing size and complexity of digital ICs, along with the requirement for better test quality (high test coverage of diversified fault type models) had resulted in an explosion of test data volume and complicated test protocols. What used to be a recommended optional step in the past, is becoming a mandatory and even a crucial step for the overall test process efficiency. Test patterns validation allows for early detection of issues introduced by successive and cumulative modeling and processing steps. The earlier issues are detected, the better in terms of debug and fix time, and thus in terms of test cost. The expensive ATE time should be made profitable by reserving it to screening physical defect issues on the test chip. In embodiments disclosed herein, the problem of efficient test pattern validation may be addressed. Almost no literature exists concerning this area, and given its current and future growing criticality, this domain may be addressed with a set of innovative ideas that have been implemented in an industrial tool. Unlike some existing solutions that use a PLI (Programming Language Interface) based approach, the disclosed tool may be a standalone tool, that translates a cycle-based test-pattern file to an equivalent event-based HDL (Hardware Description Language) testbench for sake of validation under logic simulator. Industrial experiments demonstrated that this novel tool may surpass previous PLI-based tools in terms of performance (>2× runtime improvement and >3× memory consumption saving), while achieving better results in terms of robustness and validation confidence.

1. STIL to HDL Translation

As mentioned previously, a disclosed approach is to port the tester-based protocol to an HDL based domain and validate in usual manner (as one would perform a functional validation). In an embodiment, a critical step in the disclosed flow may be the STIL to HDL porting. The STIL and Verilog being different in terms of structure and intent, one cannot take the shortcut of merely transliterating similar constructs (as it would have been possible, with STIL to WGL (as discussed in tessi.com, "Waveform Generation Language [WGL] Specification") for instance). Therefore, an in-depth examination and comprehension of the STIL may be needed to eliminate misinterpretations, and an intelligent translation to ensure that the simulator is mimicking as accurate as possible the ATE behavior may also be needed. To be efficient, the translation process should satisfy the following requirements:

a. Ensure functional/behavioral equivalence. That is, the TB in simulation mode may precisely mimic the ATE behavior in tester mode.

b. Reduce the translation to generate a streamlined (reducing or eliminating unneeded complex constructs) and short (reduce the amount of event and code to simulate) Verilog constructs.

c. Maintain some similarities with the original STIL file for ease of debugging. These similarities concern three aspects: the naming (a STIL Signal or SignalGroup has the same naming when translated to Verilog net/reg), test data format (e.g., this is ensured using the same binary radix format in the test data file) and the hierarchy (procedural statements defined in STIL Procedure/Macro are also defined in procedural form in the Verilog).

d. The reverse translation (Verilog to STIL) is not required. This implies that not all STIL statements need to be maintained and modeled in Verilog. In particular, STIL statements and constructs that are meaningless for the simulations may be skipped (see Optimizer module).

Figure 1:
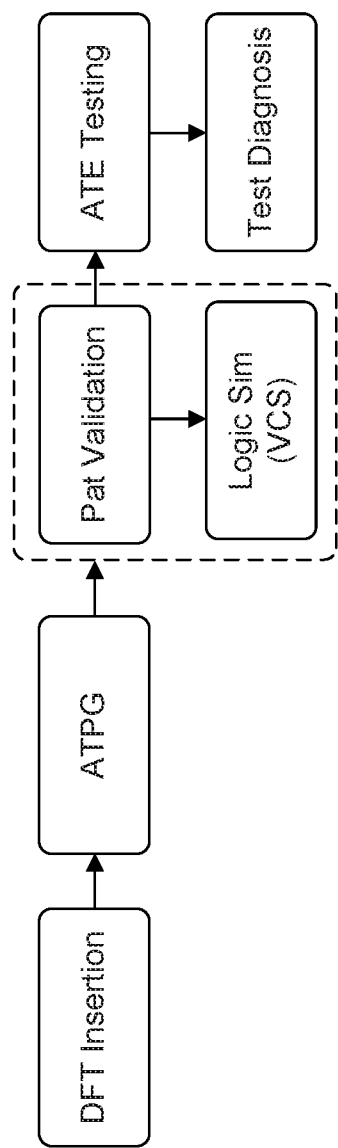
FIG. 1 is a diagram of the test process flow, according to some embodiments of the present disclosure.
Figure 2:
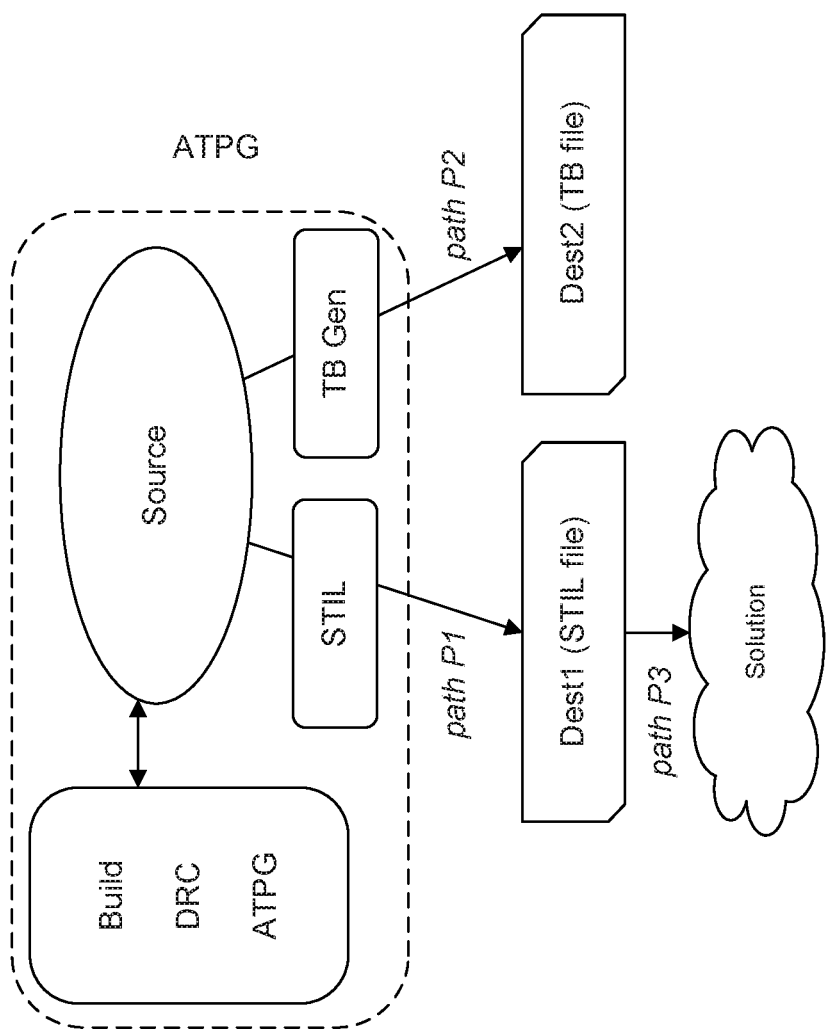
FIG. 2 illustrates concerns of an ATPG-generated TB, according to some embodiments of the present disclosure.
Figure 3:
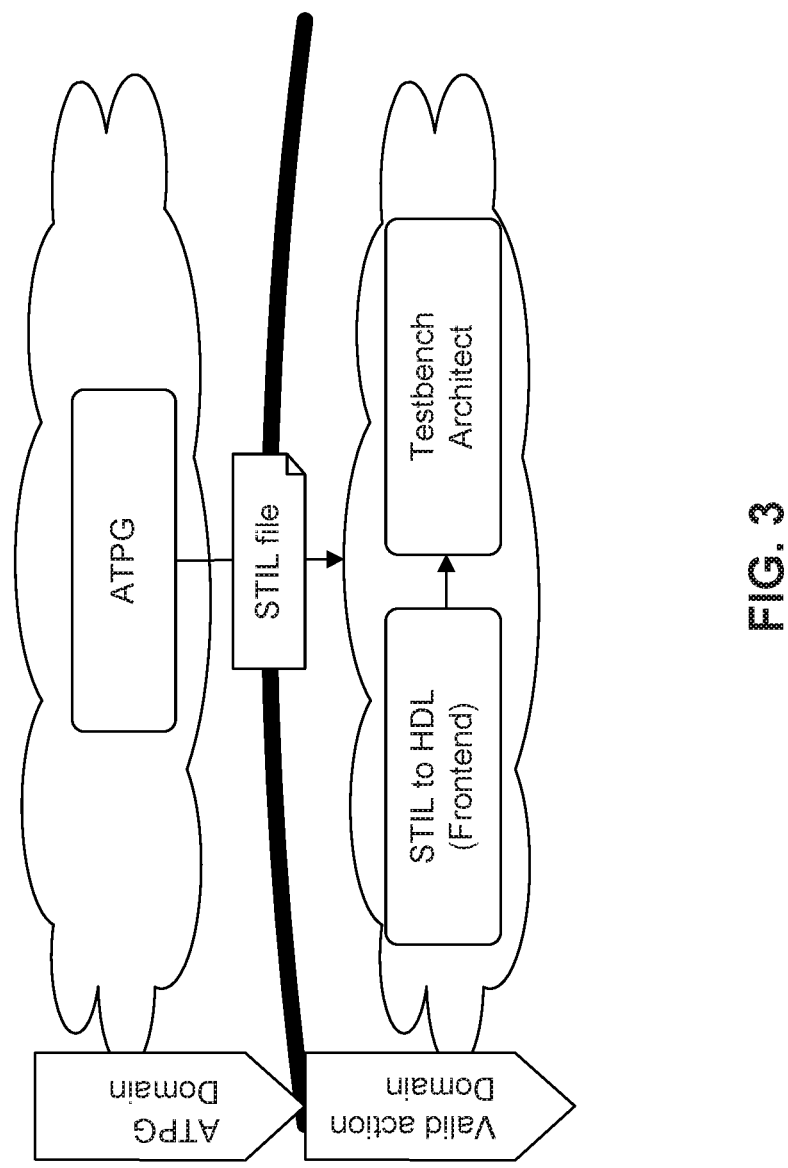
FIG. 3 depicts a general principle of a PatVal approach, according to some embodiments of the present disclosure.
Figure 4:
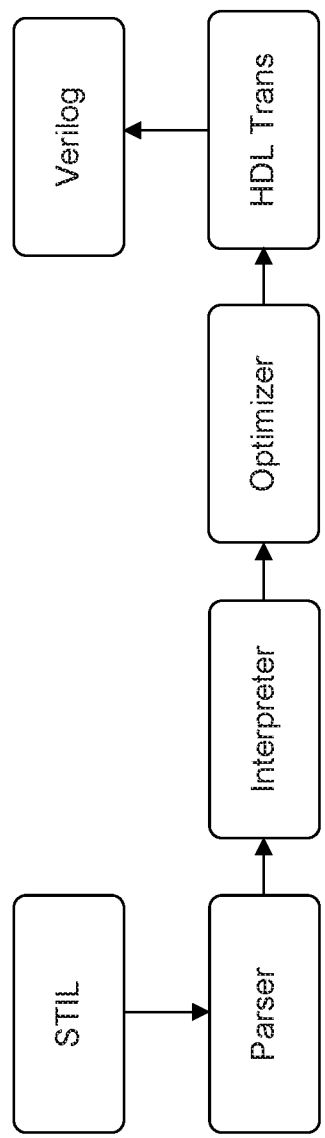
FIG. 4 depicts a translator engine used to transform a cycle-based tester format (e.g., STIL) into an event-based HDL format (e.g., Verilog), according to some embodiments of the present disclosure.

The overall STIL-to-Verilog framework is given in FIG. 4. It may be composed of a cascade of modules, each addressing a specific functionality and driving the next module. First, the STIL parser may perform the required lexical and syntax analysis. At this level, incorrect syntax STILs may be rejected.

Next, an Interpreter block may perform a semantic analysis to capture the exact meaning of each block. The resulting analysis may be captured in the internal VP (Virtual Patterns) data structure, that is independent from both the source (STIL) and destination language (Verilog). Thereafter, the Optimizer module may operate on this data-structure to perform various improvements, such as removal of STIL constructs that are redundant for the simulation (e.g., rather than maintaining three consecutive STIL Condition statements, the VP structure may maintain a definition of the resulting C), removal of meaningless statements (e.g., STIL WFT and C specified at the end of a Procedure, since the original context will be restored and these statements have no effect) and the compression of verbose information (e.g., hierarchical PatternBurst that can be flattened).

In addition to smaller code generation (e.g., reducing the size of the VP structure to manage STIL having significant number of test patterns, so that the system memory limit is not exceeded), such improvements may target faster simulation by translating instructions to mimic the STIL ATE behavior. Finally, the HDL Translation module may implement transformation rules to translate each block of the STIL file into its "functional" equivalent Verilog (i.e., using a one to one or a many to many mapping). Once these basic blocks are derived, they may be passed (next section) to the TB Architect module to build the final shape and perform final Verilog optimizations to derive the Verilog TB.

FIG. 4 depicts a translator engine used to transform a cycle-based tester format (e.g., STIL) into an event-based HDL format (e.g., Verilog), according to some embodiments of the present disclosure. The general framework of FIG. 4 may be reinforced with further considerations. Indeed, when studying a STIL structure it is composed of different sets of information: test flow part (PatternBurst, Pattern blocks), test procedures and macros such as load_unload and capture procedures, test data, test timing information (event conversion) and the test structure definition such as the chains and BIST circuitry.

Figure 5:
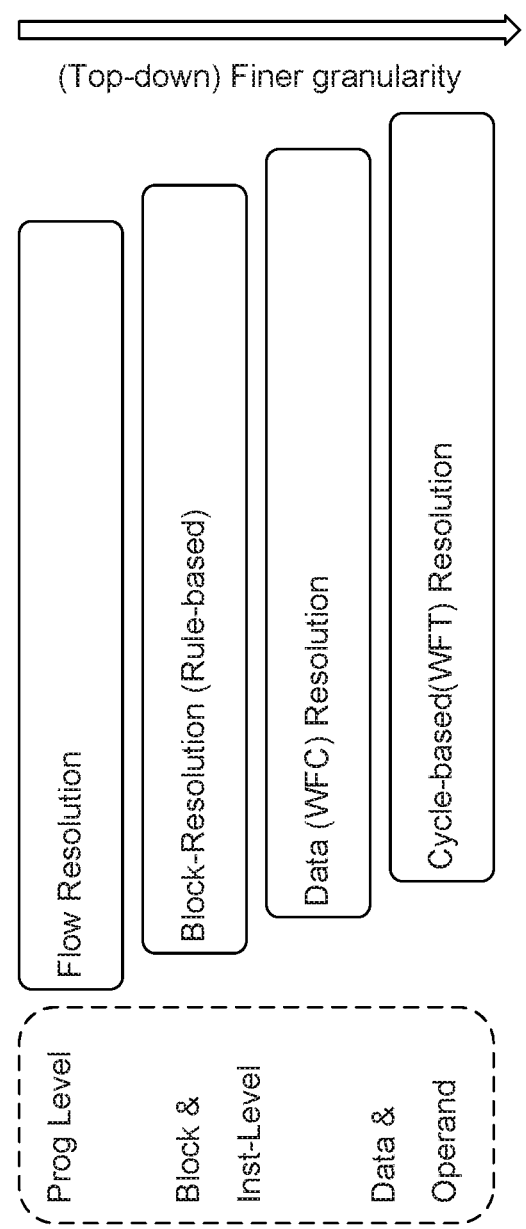
FIG. 5 shows the hierarchical and incremental interpretation of the interpreter and HDL-Translation modules, according to some embodiments of the present disclosure.

FIG. 5 shows a general framework of modules. To be more efficient, a top-down adaptive approach that distinguishes between these various sets of the STIL file and provides the adequate processing for each type may be used. The Interpreter and HDL-Translation modules may operate according to the general scheme of FIG. 5. With the exception of Structural blocks (ScanStructures and UserKeywords) that are treated directly by the backend (TB-Architect) since they may be DUT related and may require some inference to capture additional specific information, all other blocks may be handled by this processing scheme.

FIG. 6 shows a STIL flow, for example, and equivalent Verilog schedule, according to some embodiments. First, the Interpreter may interpret the execution flow corresponding to the present STIL file. The exact scheduling of the different Pattern blocks may be retrieved, so that the Verilog TB may later reproduce the same execution flow. Then, the Interpreter may move to the active patterns block, and from the calling statements, may retrieve the definition of Macros, Procedures, WFTs . . . , and may store them in the VP structure. The HDL-Translation module may then implement a rule-based translation (e.g., when a condition in the source language is hit, its corresponding block in the destination language may be generated) for each block represented in the VP structure. Next, a cycle resolution may process the active WFT and retrieve the cycle period and timing domain, followed by data resolution, where the WFC corresponding to that WFT may be interpreted as one or more (low, high, tristate) events. The latter may be coded in a two-bit codeword (one bit to indicate the mode, e.g., input/output/bidirectional; the other to indicate the four-bit Verilog value 0, 1, x, z). Further details about WFT can be found in S. Boutobza, et al., "A Journey from STIL to Verilog," paper 182, EWDTS 2018. Once the STIL statements are translated to their Verilog equivalent, they may be passed to the TB Architect. This block may comprise two main goals. In an embodiment, these basic building blocks may be combined to give the final shape and implementation of the TB according to a general template (described in the next section). In another embodiment, TB architect may improve the implementation of some constructs according to the simulation capabilities (e.g., load_unload Procedure in parallel mode).

2. TestBench Architect (Static View)

Figure 7:
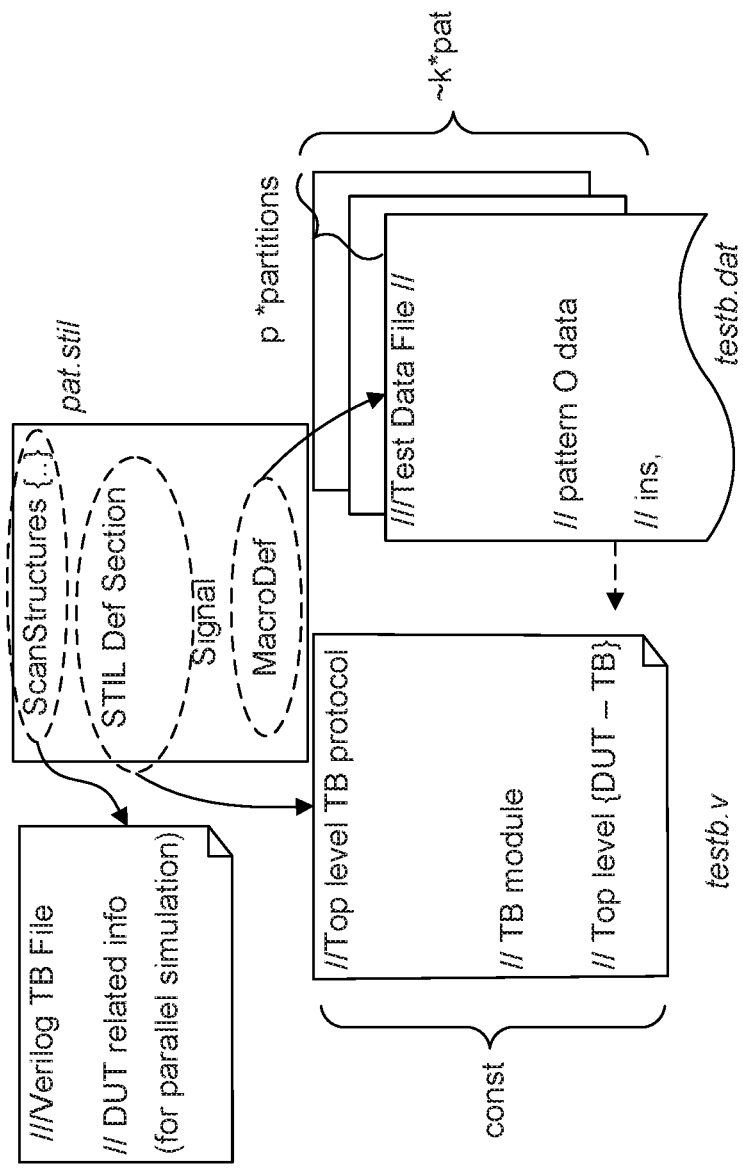
FIG. 7 illustrates an overall TB structure, according to some embodiments of the present disclosure.

FIG. 7 illustrates an overall TB structure. The TB architecture plays a crucial role as may be the one that has the most significant impact on the performance and quality of PatVal. The runtime performance may be the main target since the pattern validation constitutes the bottleneck of the EDA test flow in terms of execution time. On the other hand, in system memory may also require special consideration. Multi-CPU machine architectures may often have a lack of memory capacity which may imply memory swapping leading to an overall runtime degradation (sometimes even crashing). Finally, a minimum debug level, such as the failing pattern, cycle number and scan-out pin, may be necessary to effectively deal with the complexity and size of today's DUTs. By considering the above criteria while exploiting to a large extent the specific structure of the STIL, an original TB architecture with the following properties may be needed. The architecture may be a layered architecture that efficiency manages the complexity of the STIL protocol, and may use a modular structure that increases its independence from the DUT and STIL data to maximize reusability. The overall TB structure is represented in FIG. 7. In an embodiment, it may exploit the topology of the STIL file and use an efficient division between the test protocol part, test data part and the DUT structural information.

Test generation, manual or automatic, may require certain input about the architecture of the design to test and its intended usage, such as clocks, scan chains, scan procedures, etc. STIL may include constructs for most of the above. An approach of the enhanced techniques disclosed herein is to take benefits of the resources and time spent by the ATPG to derive detailed knowledge about the DUT test structure, to overcome parsing and interpreting again the netlist information. Hence, flexibility of the STIL may be exploited, notably through STIL user defined keywords, to retrieve such structural information. The top level Verilog module may instantiate the DUT and the TB protocol module and tie them together (testb. v file). The TB protocol module may hold all the definition section of the STIL file. It may be composed of modules that reproduce the execution flow corresponding to the STIL test protocol (FIG. 5), as described later.

The simulation data may be extracted from ATPG input, e.g., STIL patterns, interpreted and stored in the test data file (testb.dat). This file may encode the execution part (Pattern blocks). This part may be proportional to the number of patterns and may be arranged asp partitions of k patterns each (when p=1, there is one single .dat file that stores all test patterns). It may be generated either in hex, ASCII, or full binary code. Each subsection may contain an opcode representing the test data corresponding to the complete application of that pattern (e.g., apply and capture values on primary inputs and primary outputs).

The disclosed TB architecture may allow for several benefits. First, the TB streamlining and readability may be improved due to the clear separation of the control/protocol part from the data part. This, in turn, may considerably streamline debugging of such TB to identify the control part (such as not mimicking the STIL protocol, hence an issue in the TB generator) or the data part (the test patterns themselves were badly generated, hence an ATPG issue) as a culprit behind certain defects. Second, the isolation of test data in a specific ASCII file may allow for high flexibility to manipulate those data for various purposes such as exploiting some compression techniques to reduce the size of this file and efficiently manage test data volume of multimillion gate designs, or data splitting over partitions for purpose of test time reduction through concurrent patterns validations. Also, for modern compiler-based simulators, the impact of compilation time overhead (might take a whole day for large designs) on the overall simulation time, may be significantly reduced by compiling one time and reusing the same executable with different patterns and test setups. This generic capability may accommodate for various protocols and may allow to process different STILs using the same executable (no TB regeneration neither recompilation) notably for concurrent pattern execution using different machines (Reference Synopsys "TetraMAX Test Pattern Validation User guide" version N-2017.09-SP4, March 2018.).

Further, some embodiments the disclosed architecture may provide a flexible framework for fault injection (refer to the first paragraph of Section 4 below), and through its native Verilog TBs, may overcome robustness issues of PLI-based tools (PLI compatibilities with various platforms such as SuSE64 and sparc055 have been long-felt concerns in the industry).

Figure 8:
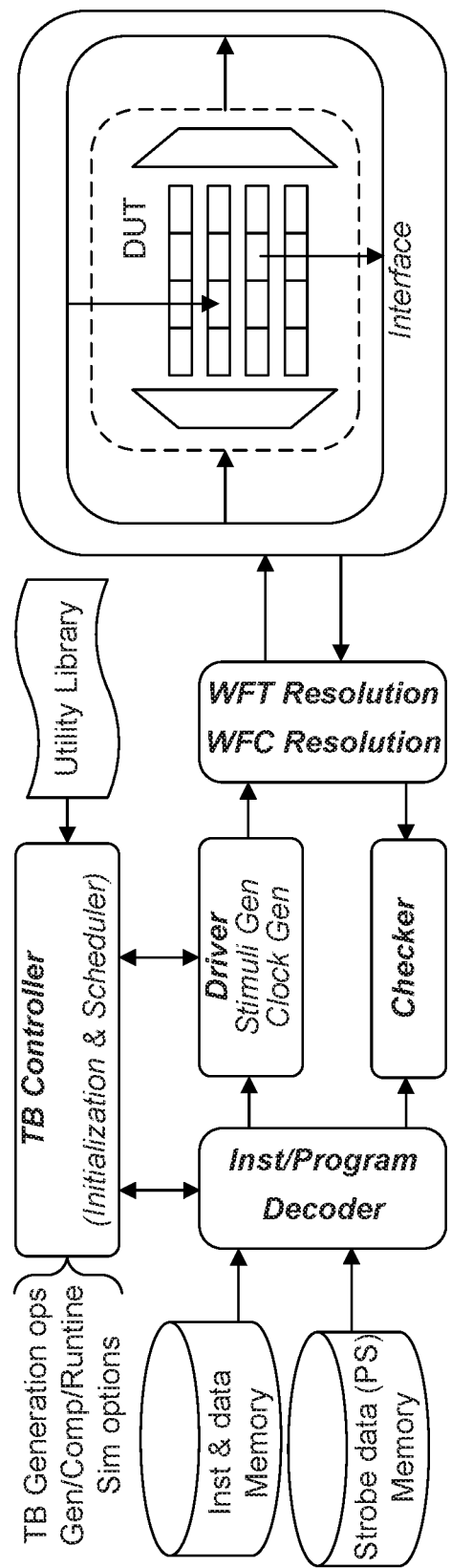
FIG. 8 illustrates an TB template, according to some embodiments of the present disclosure.

FIG. 7 illustrates an overall TB template. TB protocol architecture (per the template depicted in FIG. 8) may use a layered TB approach, a key concept for any modern verification methodology as discussed by Chris Spear, *System Verilog for Verification: A Guide to Learning the Testbench* (2006) at page 15. At the very top level resides the TB Controller. It may implement the Scheduler module seen in Section 4 below (Application to Pattern Validation) and depicted in FIG. 6. TB Controller may control the overall simulation according to a user's settings (generation, compilation and/or runtime), and may define the overall simulation mode (serial or parallel) and required tuning (e.g., timescale). The start, advance and the completion of the simulation (normal completion or premature completion after n failures or p patterns) may be manipulated. The initialization of all internal variables and memories (trough Initial Verilog block) may also be manipulated. The initialization may concern the TB itself and not the DUT; that is done through a dedicated STIL test_setup Macro (same as the one used by the tester).

The instruction-program decoder (Inst-Program Decoder), according to some embodiments, may be a mid-level controller in charge of executing or running the active STIL Pattern block, or in the case of patterns splitting, the test patterns subset. In essence, the instruction-program decoder may read the corresponding instructions from an instruction-data (Inst-Data) database, may decode and convert them into internal control signals for the Driver module to apply the test vectors and generate the clocks, and may allow a checker to verify the collected responses. Once an instruction is decoded, its corresponding Verilog block may be activated. While iterating through these instructions and executing them, it may report the execution progress with more or less details using various verbosity levels such as, cycle, instructions, or pattern level. Upon its completion, a Verilog event may be sent to the TB Controller (Scheduler) to prepare the data for the next set of patterns to be executed and another iteration to possible be initiated. Another function of such module may be to make sure, through a system of signature coding/decoding, that the provided Inst-Data database corresponds indeed to the TB protocol (the generic capability reuses the same TB with updated/modified test patterns).

The driver module may operate at the signal level. It may apply the basic drive/force operations once the instruction is decoded by Inst-Decoder, be it an inline Vector, or a given Macro or Procedure (in this case the block iterates through the body of the corresponding task and applies the basic instructions). To ensure its proper operations, Driver may rely on special functions, the signal resolution (notably in presence of signal groups, and signal reference) and corresponding WFC resolution according to the current active WFT. This may be managed by always blocks, dedicated tasks, or a combination thereof. Alternatively, the WFT resolution may schedule on these signals the appropriate WFC events at the right instant (delayed Verilog non-blocking assignments), then may advance the simulation time and complete the current cycle.

Clock generation may operate in a similar manner as an input stimulus, a signal (clock) assigned to a WFC (a pulse) according to the active WFT. Thus, unlike functional testbenches, the clock generator may not be hard coded within the TB. Instead, it may be fully controlled, cycle by cycle, by the ATPG generated STIL file (the occurrence of a given clock, its waveform and its synchronization, are all handled by the active WFT in the current context). For response assessment, a self-checking approach (checker) may be used. Given the nature of the test patterns validation (a STIL file that contains the expected data), this may be a preferred approach in terms of simulation time (providing on the fly validation results). An offline comparison, requiring state dumping of all scan cells, may have a drastic impact on simulation speed (can easily exceed 10x). However, with the long simulation time of today's very big designs (a few days to 1-2 weeks for serial simulation), it may prevent capturing and revealing issues very early in the validation process, a highly desirable capability notably to stop the simulation and anticipate patterns debugging.

Checker module may compare the expected data against the strobe data to assess the pass/fail status. To derive the expected data, it may use the same signal, WFC and WFT resolution tasks as the Driver. The difference is that here the STIL event (expected data) may be strobe events (e.g., L, H) rather than force events. To collect the response data, it may monitor, for a given instant or during a timing window (according to STIL strobe or strobe windows WFCs), the primary outputs and scanout signals when it runs a serial simulation (through an always block with forever statements), or the internal nodes when in parallel mode (using a dedicated task). When these data are different, appropriate failure reports may be issued (see FIG. 12 for an example).

At a low level, the Interface block (a Verilog module) may ensure communication between the TB and the DUT. In this manner, it may isolate the specificities of the DUT from the rest of the TB. Alternatively, it may allow two essential access modes, serial access through primary I/O of the DUT and parallel hierarchical access (using force/release Verilog statements). In another access mode, the insertion of user defined analog-to-digital (A/D) and digital-to-analog (D/A) converters to adapt a TB environment for analog testing may be used. It is to be noted that this module holds the hierarchical access to the scan-in and scan-out of the cells. For multimillion-flip-flop designs, a specific Verilog module may be isolated to enable streamlined operation of a targeted logic simulation. This module may allow for an easy fault-injection mechanism (e.g., as detailed in Section 4 below).

The Utility Library may be used by previous blocks for various repetitive operations that are useful and invariable with regard to different projects. It is a library of reusable tasks and routines such as error handling or routines for save and restore of simulation context at the boundary of STIL Procedure.

By devising such layered and modular structure, the objective was twofold. First, TB reuse may be maximized by increasing independence from both the DUT and STIL files. For instance, module Utility Library may be invariant to the STIL and DUT, while module TB-Controller and Inst-Program Decoder may be independent from the DUT and may be reused across different projects. Likewise, these modules may be independent of STIL data (i.e., the user may generate various test patterns and apply them while preventing regenerating or recompiling the TB protocol), while module Interface may be independent from both the STIL data and protocol. Second, robustness and debug efficiency may be improved by addressing its complexity and subdividing the overall test function in small modules, each handling a dedicated task/mission. Thus, the architecture may be tailored to the nature of validation it performs (STIL) for maximum efficiency. The benefits of such choices on the performance may be seen in experimental results, while its impact on validation confidence is discussed below in Section 4 (Application to Pattern Validation).

3. TB Execution Flow (Dynamic View)

Resolution (interpretation and execution) of the STIL statements may be more or less precise, depending on the nature and implementation of the TB itself. For a PLI based approach, all events (time-value pair) may need to be resolved for each test cycle. The PLI functions (e.g., acc_get_value, acc_set_value, acc_handle . . . ) may be more accurate but also basic. What is needed is to know the applied/expected value, at which time, and for what signal. To provide such detailed information, the STIL Interpreter may then perform a cycle-based compilation concurrently with the logic simulation, to resolve the signal references, advance the simulation time, and so on. All statements may be interpreted and resolved dynamically in one single step during a simulation phase. Such behavior may have a significant overload on the simulation performance.

Figure 9:
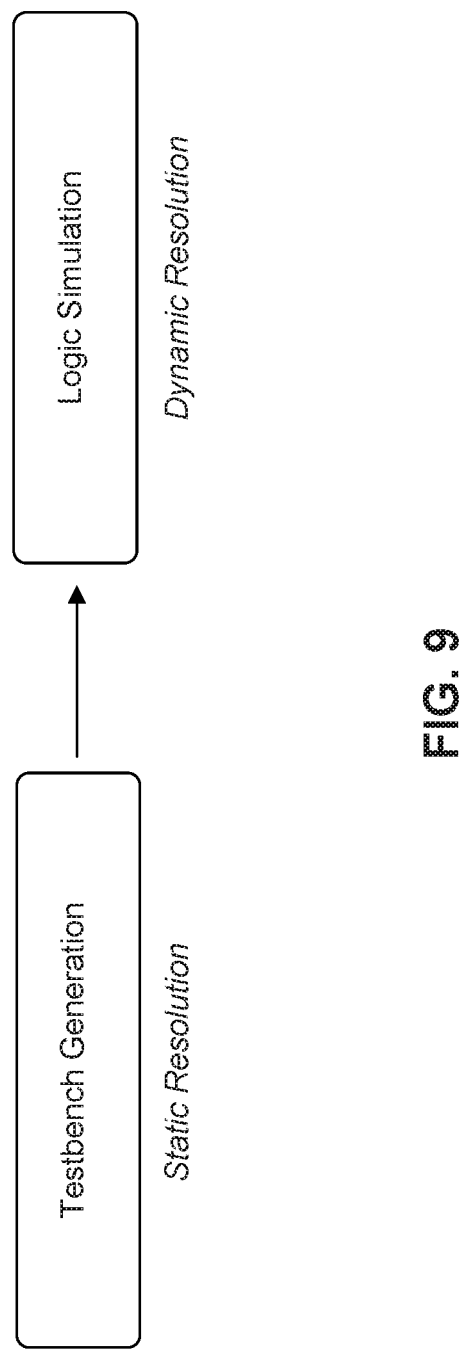
FIG. 9 illustrates two steps of the resolution process, according to some embodiments of the present disclosure.

FIG. 9 illustrates two steps of the resolution process, according to some embodiments of the present disclosure. In a context of native Verilog TB, the whole test data may be required to be available beforehand. However, may not be required to be fully resolved. Between brute-force full resolution pre-simulation and no resolution at all (PLI-based approach), the TB may be appropriately modeled to follow a third path in between. In one approach (FIG. 9), the resolution process may be performed in two steps: a static resolution during the generation phase, followed by a dynamic resolution during the simulation phase. In other words, the processing intense part of the resolution may be moved to the tool generation phase, leaving the dynamically interpreted part to be handled by the TB at logic simulation phase. By doing so, the processing during simulation is reduced which in turn may allow for a significant runtime improvement as demonstrated by various benchmarks. This process may provide a human-readable testbench that may considerably ease the debug process. An example to clarify the disclosed approach is depicted in FIG. 10 and described further below.

Figure 10:
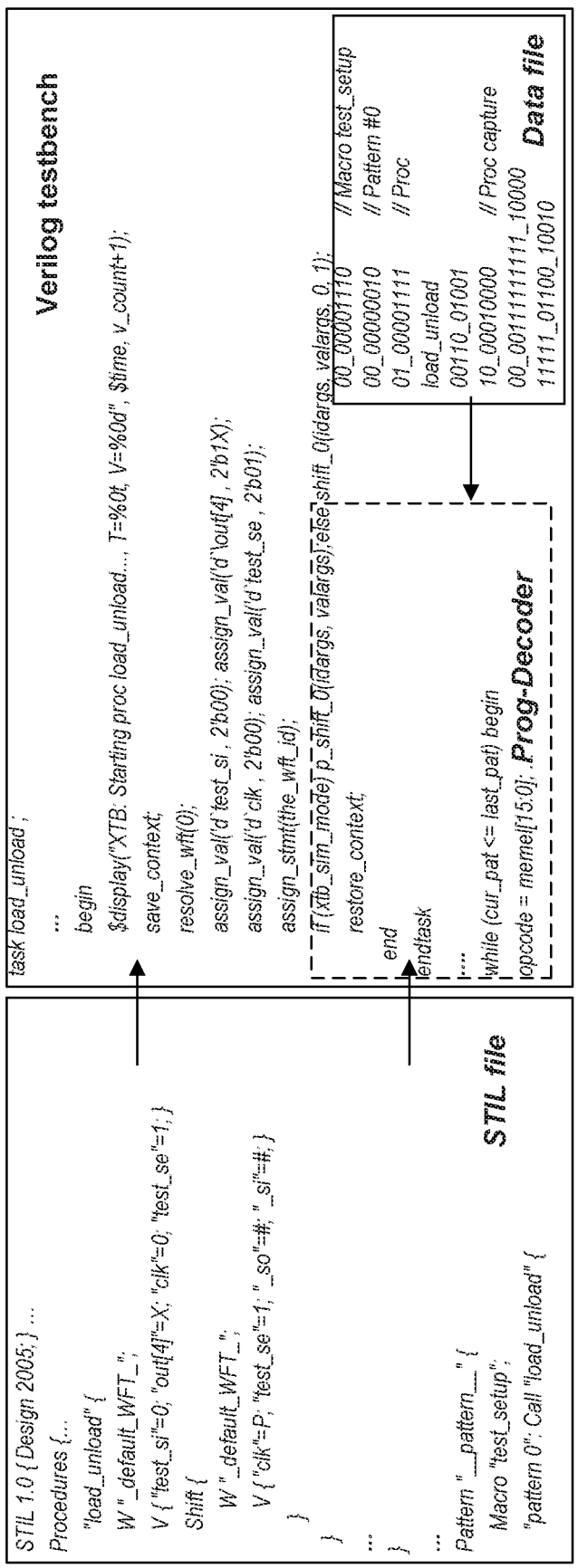
FIG. 10 shows a STIL file and its corresponding generated TB file, according to some embodiments of the present disclosure.

FIG. 10 shows a STIL file and its corresponding generated TB file, according to some embodiments of the present disclosure, which shows some excerpts of a TB generated using the enhanced techniques disclosed herein. Consider for instance the "load_unload" Procedure. The STIL-Verilog Translator may model the definition of this Procedure (top of STIL file) in an appropriate format, such as a Verilog task construct. To do so, the STIL Interpreter may point out that this is a Procedure and provides its statements and execution order. Additional resolution may not be required. The Procedure statements may then be translated to their equivalent Verilog models and the body of that task may be fully defined (top of testbench file).

Subsequently, in the Pattern block, this Procedure may be called (bottom of STIL file), which may cause the TB Generator to translate the call to an equivalent Verilog task call (the Prog-Decoder module) and its corresponding arguments converted to appropriate codewords in the data file. Then the Verilog task itself may take the WFC (LLHHL and 01010), retrieve their definition from a "default_WFT_" WFT, and apply the retrieved value to the referred signal (e.g., "out[4]" and "test_si"). Accordingly, the Verilog TB may fully handle resolution of this call, and no further resolution may be required from the STIL interpreter (to resolve WFC 0, for instance). Therefore, dynamic resolution may be used at an instruction level (the Procedure level).

4. Application to Pattern Validation

Apart from of the performance aspect that are presented in next section, this section evaluates the enhanced techniques described herein against criteria described above in the background section for test-pattern validation. As mentioned previously, the validation confidence may be of critical importance. In an embodiment, this criterion may be covered at various levels. First, at the contrary of some existing solutions, the actual STIL targeted for the tester may be processed, hence a genuine PatVal process may be performed. Second, the usage of a logic simulator coded in a different manner (using an event driven paradigm and a Verilog language to validated test vectors computed by an ATPG tool and expressed in STIL), may increase the confidence of test data correctness. In general, the more different the two methods that give the same results, the higher the confidence with the correctness of the result. Third, validation confidence may be reinforced through fault injection mechanisms (the system should successfully detect an injected fault and report a failing simulation, otherwise it is invalid).

The disclosed test pattern validation may dispose of two mechanisms to ensure such task. A first mechanism may be a fault injection through the design, using the Interface module where all cells may be organized in a well-defined hierarchy. This may allow for injecting permanent and/or intermittent stuck or transition faults very easily (e.g., using force Verilog statement on the hierarchical nodes followed by release statement at the desired instants). Another mechanism relies on the extracted STIL data, by changing the intended reference data in the .dat file.

Unlike traditional fault injection approaches that deal with the DUT itself, this nonintrusive approach may allow the attempt of several fault injections scenarios without recompiling, which may result in saving a tremendous amount of time for today's big designs. This fault-injection mechanism may result in enhanced debug capability. For example, once an injected fault is detected (validation confidence), its related debug data may be corrected and aligned (correct faulty pattern, cycle, pin . . . ).

A mismatch occurrence may reveal a discrepancy between the expected data (as computed by the ATPG tool and provided through the STIL file) and the response data obtained from the simulation. Two example cases are presented here:

1. The reference data are wrong. At this stage of development, the DUT may have already undergone multiple cycle of validation, so the issue may likely be on the golden data, that is, the ATPG tool was unable to correctly simulate the right behavior (e.g., the ATPG netlist and simulation library are different, or they are not different but ATPG where an optimization process on the read libraries leads to may lead to a faulty simulation model).
2. The simulation data are wrong. Although occurring less frequently, this may be a real case that may reveal a bug in the generated testbench, a wrong DUT specification in test mode (DUT simulation models behave differently than ATPG models), or a timing related issue (e.g., strobe time or event not well placed).

Case 2 represents a "false negative" situation, such that the validation environment reveals mismatches, but not necessarily due to the fact that the test data are wrong. Very often this case may require additional investigation steps such as a careful and deep waveform view analysis. Case 1 may be a "true negative" that triggers the debug capability of the solution to investigate the root cause of the bad test patterns.

Unlike physical testing, which is performed on the actual chip, in a verification conducted on a software model, all signals and latches may be observable during the simulation. Accordingly, a high debug flexibility may be realized.

FIG. 12 shows a TB simulation report, according to some embodiments of the present disclosure. Together, FIGS. 11 and 12 shows examples of outputs and debug information provided in accordance with some embodiments of the enhanced techniques described herein. In addition to the above built-in debug capability, a user may leverage the flexibility of the solution to build unique debug constructs (i.e., user-defined monitoring). Additionally, at least two simulation modes may be presented, e.g., for serial and parallel execution schemes. Serial scan mode is a behavior as performed by the tester.

Serial-scan mode may relyon the DUT interface (primary scan-in scan-out pins) which is fully defined in the STIL. The parallel mode may be the broadside test as discussed in B. J. Oomman, W. T Cheng, and J. Waicukauski, "A universal technique for Accelerating Simulation of Scan Test Patterns," pp 135-141, ITC 1996, augmented with other minor modes, such as nshift (serial n bit shifting after m-n scan cells in parallel access, mainly to manage shadows registers that are not scan cells), and multibit cells to yet perform local serial shifts for their segments (inside a scan chain, the head and tail cells of a given multi-bit segment may be directly accessed). Contrary to R. Raghuraman's, "Simulation requirements for vectors in ATE formats", pp. 1100-1107, ITC, 2004, parallel mode may be supported for all compression technologies provided by these test tools. By performing force and strobe accesses directly on the scan cells in parallel manner, the overall test time may be greatly reduced (save m−1 shift cycles in presence of m-length scan chains per test pattern). This may be inside the same patterns set. Using pattern splitting capability, concurrent patterns validation may be performed by running p partitions in parallel to reduce overall test time further.

5. Implementation and Experimental Results

A proposed solution was implemented in a standalone industrial tool as shown in S. Boutobza et al., "An Automatic Testbench Generator for Test Patterns Validation" (IEEE EWDTS 2018). This tool had to fulfill several requirements. Among them are: the ability to validate STIL files generated by the TetraMax tool, as discussed in Synopsys "TetraMAX User Guide" version N-2017.09-SP4, March 2018 (all types of faults, all types of ATPG algorithms: Basic ATPG, Fast and Full Sequential), the support of all DFT configurations generated and inserted by the DFT Compiler Tool as discussed in Synopsys "Design For Testability compiler (DFT) User Guide" version N-2017.09-SP4, March 2018 (including various compressed and non-compressed architectures), and the ability to run on all existing logic simulators. Besides its functionality as an automatic TB generator, the tool may implement other useful utilities such as a simulation scripts generator (e.g., that may generates shell based scripts to compile and run along with basic simulator options), the analysis & report module that may process a STIL file and/or a simulation log, and may generate various useful views and reports in human readable formats (e.g., report the structural view of the DUT, report patterns information or report failing scan cells name and hierarchy from simulation cycle, cell index and compression mode). Utilities of these tools allow handling STIL files and simulation log files that may range into many gigabytes in size—such files may be too large for practical handling using conventional tools such as many common text editors, for example. Thus, utilities of the Analysis & Report module may efficiently excerpt and summarize desired information from bulk logs or other files. Also, the tool may generate a diagnosis report similar to the datalogger generated by the tester. The report may be provided in cycle-based or pattern-based format to the ATPG's failure-analysis tool for diagnosis. Finally, the tool may allow for zero-delay simulation to verify test patterns correctness, using multiple execution schemes, and for back-annotated post-silicon simulation, further providing test-timing closure.

FIG. 11 shows a TB generation report, according to some embodiments of the present disclosure. FIG. 11 shows a snapshot of TB generation and simulation of a PatVal example (e.g., 12 patterns divided into 4 partitions) using a compression DFT technology and a stuck-at fault injection. Note the failures observed at the scan outputs and the enhanced debug provided by the testbench indicating the exact faulty scan cell.

Runtime for testbench generation is negligible; it lies between a few seconds to a few minutes to scan multimillion-flip-flop designs. Likewise, the memory consumption at this stage is not a bottleneck, it remains within twice the STIL file size (a compact format relative to other formats like WGL). These two factors may be monitored during the compilation-simulation phase where their effect is highly amplified (at least ten times their generation-phase counterparts).

Table 1 summarizes various experiments using real industrial circuits. These experiments were conducted in various simulation modes (serial, parallel, . . . ) and using different DFT compression techniques. A net improvement using VerilogDPV tool was observed as can be found in S. Boutobza et al., "An Automatic Testbench Generator for Test Patterns Validation", EWDTS 2018, where on average 2-3 times improved simulation runtime and double memory reduction is achieved. These results concern rather small to medium designs. Still, this tendency is even well marked with big designs. For instance, with a design of one million flip-flops, runtime improvement for both serial and parallel schemes (compilation+simulation time) more than tripled, and a six-fold improvement in system memory saving has also been observed.

Such results do not include concurrent pattern validation mode (using patterns splitting capability seen in section 2) that would drastically improve the overall simulation time: $T_{all}=\max(T_i)$, i partition number (i.e., total simulation time equals longest simulation time of all partitions). Besides these important performance factors, the disclosed approach may open up the tool for large debug capabilities (section 4, Application to Pattern Validation). A user may dispose of built-in implemented features, as well as a flexible platform to easily build unique debug constructs. Such capabilities were not previously provided (by nature, the PLI is a black box that the user cannot access or customize).

TABLE 1

New PatVal Tool vs. Old PLI-Based Tool (100%) Performance for Scanning 50-250K Flip-Flop Designs

| | Serial Sim | | Parallel Sim | |
| --- | --- | --- | --- | --- |
| Design | Memory | CPU | Memory | CPU |
| D_97K | 0.25 | 0.65 | — | — |
| D_92K | 0.39 | 0.77 | 0.56 | 0.48 |
| D_10K | 0.16 | 1.25 | 0.94 | 0.40 |
| D_10K | 0.43 | 0.94 | 0.48 | 0.34 |
| D_51K | 0.26 | 0.68 | 0.30 | 0.37 |

Using a simulation event-based approach and an HDL based description, an efficient automatic testbench methodology to validate ATPG test patterns targeted for cycle-based testers was provided. This methodology is built upon the principle of complete separation between the ATPG domain and the validation domain and relies on an original layered testbench architecture tailored for test patterns validation.

The disclosed solution was implemented in an industrial tool that uses the standard STIL as an input and produces a native Verilog testbench that ensures full validation of both the STIL test protocol and test patterns. This tool allows for 2-3 times runtime improvement and 3 times the memory-consumption improvement over previous PLI-based pattern-validation tools.

The disclosed modular building-block structure may allow extending the tool to support other outputs formats (adapting the last two modules HDL-Translator and TB-Architect). The SystemVerilog target is an example of such extension. Besides, the modular TB structure (e.g., FIG. 8) may lend itself well to other embodiments proposed by such language (e.g., Interface, Test). Its generic concept may permit its usage in a broader context such as discussed in Synopsys "DesignWare STAR Memory System User Guide," version N-2017.09-SP2, March 2018 and BSDC Synopsys "Boundary Scan Compiler User Guide," version N-2017.09-SP2, March 2018, platforms. Furthermore, the tool may be used to translate any valid STIL of interest to its equivalent Verilog file to be simulated on a logic simulator and study its behavior, such as STIL functional validation. The disclosed tool may support RTL as well as gate-level testing and may offer enhanced productivity for test engineers by reducing the design and implementation time spent in creating test-benches to validate the test patterns, and a streamlined debug capability earlier in design flows, in case of failures of the test patterns.

Figure 13:
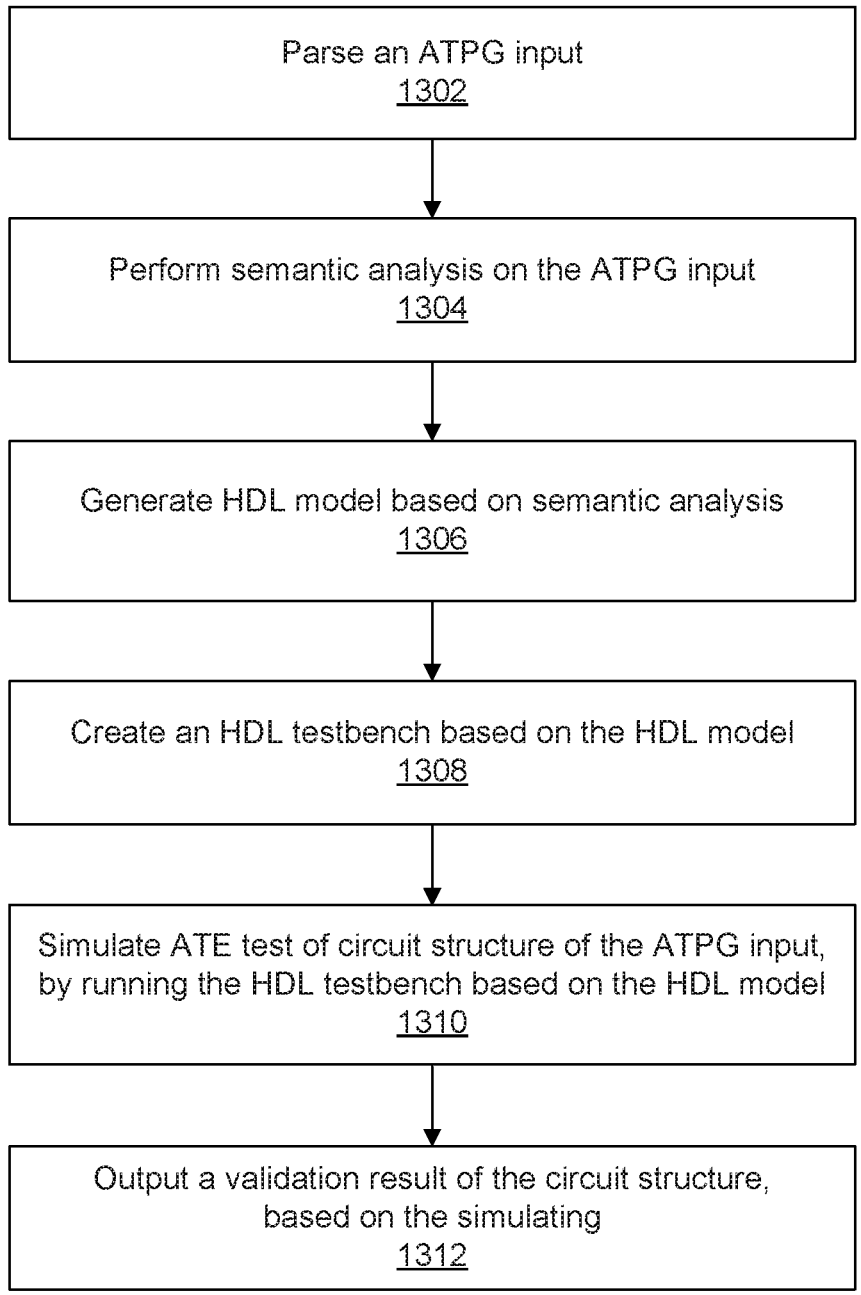
FIG. 13 is a flowchart illustrating an example ATPG method, according to some embodiments of the present disclosure.

FIG. 13 shows an example method 1300 for image conversion and reorientation with selection of regions of interest, according to some embodiments. Method 1300 may be performed by processing logic that may comprise hardware (e.g., circuitry, dedicated logic, programmable logic, microcode, etc.), software (e.g., instructions executing on a processing device), or a combination thereof.

Method 1300 shall be described with reference to FIGS. 2-10. However, method 1300 is not limited only to those example embodiments. The steps of method 1300 may be performed by at least one computer processor coupled to at least one memory device. An example processor and memory device(s) are described below with respect to 1704 of FIG. 17. In some embodiments, method 1300 may be performed using computer system 1700 of FIG. 17, which may further include at least one processor and memory such as those of FIG. 17.

In 1302, at least one processor 1704 may parse at least one ATPG input. In some embodiments, parsing in 1302 may include lexical analysis, syntactic analysis, or a combination thereof. Further, parsing in 1302 may raise or trigger an error state if lexical analysis or syntactic analysis or a combination thereof fails. Separately, a parser may provide a warning without triggering a failure, for example, where a given keyword or syntax is acceptable but not preferred for a given target platform. In some embodiments, the ATPG input may be a STIL file or a WGL file, to name a few non-limiting examples.

In 1304, processor 1704 may perform semantic analysis on the at least one ATPG input for a first block of the ATPG input, as described elsewhere herein.

In 1306, processor 1704 may generate a first HDL model based on the semantic analysis of 1304. In some embodiments, the first HDL model may represent a circuit structure that shares functional equivalence with the ATPG input. Whether and how circuit structures are functionally equivalent with ATPG input (e.g., STIL statements) may be determined based on the semantic analysis of 1304, for example. Other examples of semantic analysis are described or referenced in further detail elsewhere herein.

In 1308, processor 1704 may create an HDL testbench based on the first HDL model. In some embodiments, the HDL testbench may include event-based test patterns that mimic a given ATE behavior, as described elsewhere herein. Other examples of event-based test patterns mimicking specific ATE behavior are described or referenced in further detail elsewhere herein.

In 1310, processor 1704 may simulate an ATE test of the circuit structure of the ATPG input, by running the HDL testbench based on the HDL model. Other examples and further details of the automated testing and HDL-model-based testbench simulation of electronic circuit structures are described and referenced elsewhere herein.

In 1312, processor 1704 may output at least one validation result of the circuit structure. FIGS. 11 and 12 provide some non-limiting examples of various outputs. If validation is successful, it is expected that a subsequent test on actual ATE is expected to be successful absent a physical defect (e.g., one-off impurity or artifact in an actual chip due to reasons other than systematic design failure at a logic/RTL/gate level, etc.). Successful validation output may thus signify an absence of systematic design failures. If the validation result as output is not fully successful, the result of the output may further facilitate debugging, locating systematic design errors, or other engineering design workflow improvements. Other examples and further details of the validation result outputs are described and referenced elsewhere herein.

Examples of how processor 1704 may perform any operations or steps of method 1300 are described further above, such as with respect to FIGS. 1-12. Any or all of the above steps may be performed as part of embodiments as shown and described further above with respect to FIG. 1-12, in some embodiments. Additionally or alternatively, any or all of the above steps may be performed as part of processing demonstrated in FIGS. 13-17, for example.

Not all steps of process 1300 may be needed in all cases to perform the enhanced techniques disclosed herein. Further, some steps of process 1300 may be performed simultaneously, or in a different order from that shown in FIG. 13, as will be understood by a person of ordinary skill in the art.

DETAILED DESCRIPTION—TECHNOLOGY SUPPORT EDA SYSTEM/WORKFLOW EXPLANATION

Figure 14:
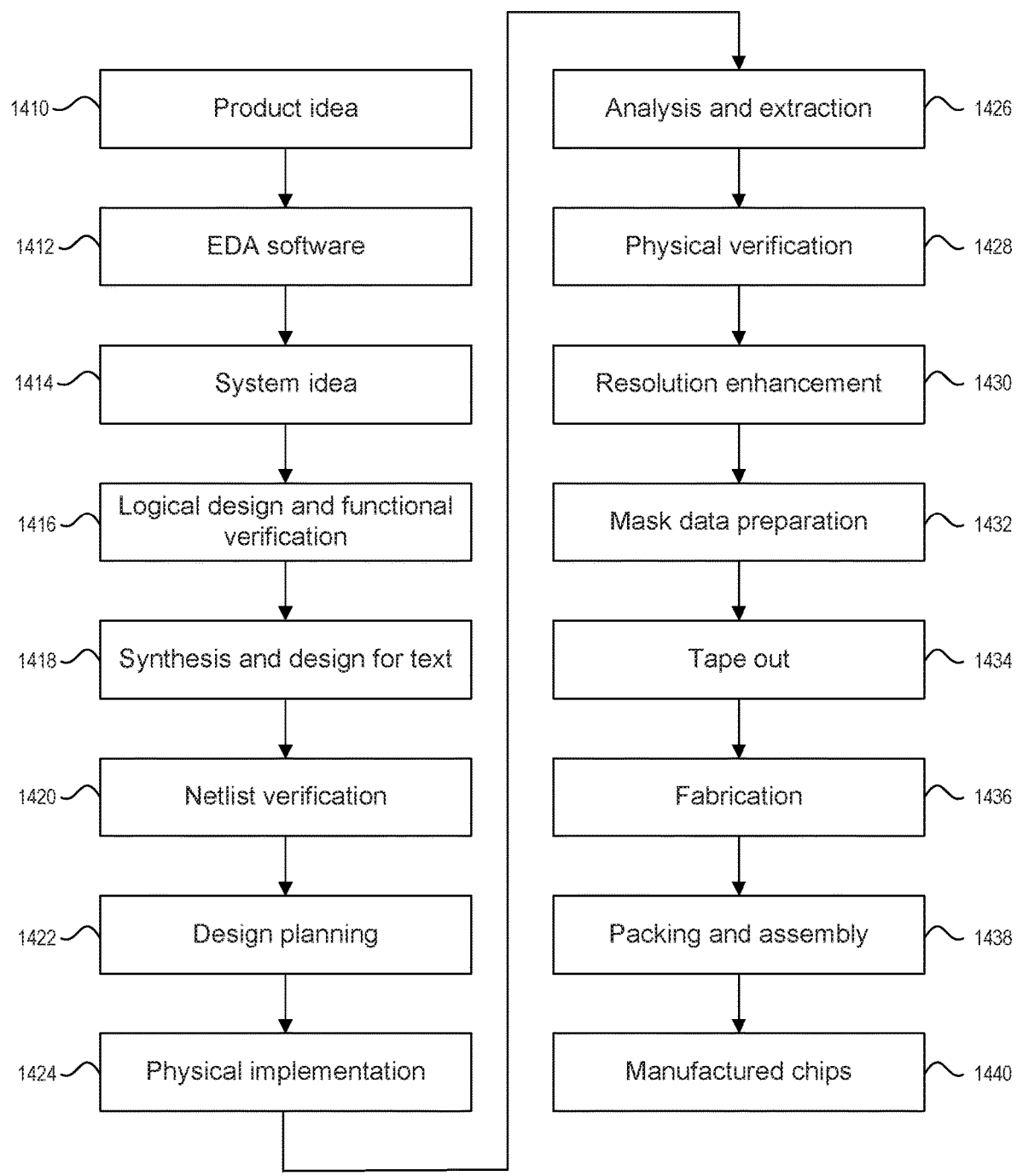
FIG. 14 illustrates a flowchart of various operations in the design and fabrication of an integrated circuit, according to some embodiments of the present disclosure.

FIG. 14 illustrates various processes 1410-1440 performed in the design, verification and fabrication of an item of manufacture such as an integrated circuit using software tools with a computer, and possibly special hardware-assisted tools, to transform and verify design data and instructions that represent the integrated circuit. The term 'EDA' signifies the term 'Electronic Design Automation'. These processes start with the creation of a product idea 1410 with information supplied by a designer, information which is transformed during a process to create an item of manufacture (referred to herein as a design or device) that uses an EDA software tool 1412, which may also be signified herein as EDA software, as a design tool, or a verification tool. When the design is finalized, it can be taped-out 1434, which typically is when artwork (e.g., geometric patterns) for the integrated circuit is sent to a fabrication facility to manufacture the mask set, which is then used to manufacture the integrated circuit. After tape-out, a semiconductor die is fabricated 1436 and packaging and assembly processes 1438 are performed, which result in the finished integrated circuit 1440 which may also be signified herein as a circuit, device, component, chip or SoC (System on Chip).

A spec, or specifications, for a circuit structure or electronic structure may be used in commerce at multiple levels of useful abstraction ranging from low-level transistor material layouts to high-level description languages. Most designers start with a description using one or more modules with less detail at a high-level of abstraction to design their circuits and systems, using a hardware description language ("HDL") such as VHDL, Verilog, SystemVerilog, SystemC, MyHDL or OpenVera. The high-level description is easier for designers to understand, especially for a vast system, and can describe very complex systems that are difficult to understand using a lower level of abstraction that is a more detailed description. Thus, a circuit structure may be represented by descriptions as code, for example, which may later be translated into physical circuit components.

The HDL description can be transformed into other levels of abstraction that are used by the developers. For example, a high-level description can be transformed to a logic-level register transfer level ("RTL") description, a gate-level description, a layout-level description, or a mask-level description. Each lower abstraction level that is a less abstract description adds more useful detail into the design description, for example, more details for the modules that comprise the description. The lower-levels of abstraction that are less abstract descriptions can be generated by a computer, derived from a design library, or created by another design automation process.

An example of a specification language at a lower level of abstraction language for specifying more detailed descriptions is SPICE, which is much used for detailed descriptions of circuits with many analog components. A circuit specification for a circuit also has value as an article of manufacture in commerce as a good under the Uniform Commercial Code. See U.C.C. art. 2, pt. 1. Descriptions at each level of abstraction are enabled for use by the corresponding tools of that layer (for example, a formal verification tool), and some of the modules of the abstractions need not be novel or unobvious.

A design process that uses an EDA software 1412 tool includes processes 1414 to 1432, which are described below. This design flow description is for illustration purposes only and is not meant to limit the present disclosure. For example, an actual integrated circuit design may require a designer to perform the design operations in a different sequence than the sequence described herein.

During system design 1414, a designer describes the functionality to be manufactured. The designer can also perform what-if planning to refine the functionality and to check costs, etc. Hardware-software architecture partitioning can occur at this stage. Exemplary EDA software products from Synopsys, Inc. of Mountain View, Calif., that can be used at this stage include: Model Architect, Saber, System Studio, and DesignWare products.

During logic design and functional verification 1416, modules in the circuit are specified in one or more hardware description languages, or HDLs, and the design in HDL is checked for functional accuracy, that is, to match the requirements of the specification of the circuit or system being designed to ensure that the design produces the correct outputs. Exemplary HDL languages are Verilog, VHDL and SystemC. Functional verification is typically done by using software-based simulators and other tools such as testbench generators, static HDL checking tools and formal verification tools. In some situations, special hardware referred to as "emulators" or "prototyping systems" are used to speed up the functional verification. Exemplary EDA software products from Synopsys, Inc. of Mountain View, Calif. that can be used at this stage include: VCS, Vera, DesignWare, Magellan, Formality, ESP and Leda products. Exemplary emulator and prototyping products also available from Synopsys that can be used at this state include: ZeBu® and Protolink® (RTM signifies 'Registered Trademark').

During synthesis and design for test 1418, HDL code is translated to a netlist. This netlist can be optimized for the target technology. Additionally, tests can be designed and implemented to check the finished integrated circuit. Exemplary EDA software products from Synopsys, Inc. of Mountain View, Calif. that can be used at this stage include: Design Compiler, Physical Compiler, Test Compiler, Power Compiler, FPGA Compiler, TetraMAX, and DesignWare products.

During netlist verification 1420, the netlist is checked for compliance with timing constraints and for correspondence with the HDL code. Exemplary EDA software products from Synopsys, Inc. of Mountain View, Calif. that can be used at this stage include: Formality, Primetime, and VCS products.

During design planning 1422, an overall floor plan for the integrated circuit is constructed and analyzed for timing and top-level routing. Exemplary EDA software products from Synopsys, Inc. of Mountain View, Calif. that can be used at this stage include: Astro and IC Compiler products.

During layout implementation 1424, the physical placement (positioning of circuit elements such as transistors or capacitors) and routing (connection of the same by a plurality of conductors) occurs, as can selection of library cells to perform specific logic functions. Exemplary EDA software products from Synopsys, Inc. of Mountain View, Calif. that can be used at this stage include: the Astro and IC Compiler products.

During analysis and extraction 1426, the circuit function is verified at the layout level, which permits refinement of the layout design. Exemplary EDA software products from Synopsys, Inc. of Mountain View, Calif. that can be used at this stage include: Astrorail, Primerail, Primetime, and Star RC/XT products.

During physical verification 1428, the layout design is checked to ensure correctness for manufacturing constraints such as DRC constraints, electrical constraints, lithographic constraints, and circuitry function matching the HDL design specification. Exemplary EDA software products from Synopsys, Inc. of Mountain View, Calif. that can be used at this stage include the Hercules product.

During resolution enhancement 1430, geometric manipulations of the layout are performed to improve manufacturability of the design. Exemplary EDA software products from Synopsys, Inc. of Mountain View, Calif. that can be used at this stage include: Proteus products.

During tape-out 1434, data is created to be used (after lithographic enhancements are applied if appropriate) for production of lithography masks. Example EDA software products from Synopsys, Inc., that can be used during tape-out include the IC Compiler and Custom Designer families of products.

During mask-data preparation 1432, the 'tape-out' data is used to produce lithography masks that are used to produce finished integrated circuits. Exemplary EDA software products from Synopsys, Inc. of Mountain View, Calif. that can be used at this stage include the CATS family of products.

For all of the above mentioned integrated circuit design tools, similar tools from other EDA vendors, such as Cadence, Siemens, other corporate entities or various non-commercial tools from universities, or open source repositories, can be used as an alternative.

Embodiments of the present disclosure can be used during one or more of the above-described stages. Specifically, some embodiments of the present disclosure can be used in EDA software 1412.

A storage subsystem is preferably used to store the programs and data structures that provide the functionality of some or all of the EDA tools described herein, and tools applied for development of cells for the library and for physical and logical design using the library. These programs and data structures are generally executed by one or more processors in a manner known to those of ordinary skill in the art.

DETAILED DESCRIPTION—TECHNOLOGY SUPPORT GENERAL COMPUTER EXPLANATION

FIGS. 15A, 15B and 15C are simplified block diagrams of a computer system suitable for use with embodiments of the technology, as well as circuit design and circuit embodiments of the technology.

In FIG. 15A, computer system 1510 typically includes at least one computer or processor 1514 which communicates with a number of peripheral devices via bus subsystem 1512. Typically, the computer can include, or the processor can be, any of a microprocessor, graphics processing unit, or digital signal processor, and their electronic processing equivalents, such as an Application Specific Integrated Circuit ('ASIC') or Field Programmable Gate Array ('FPGA'). The terms 'processor' and 'computer' are further defined below. These peripheral devices may include a storage subsystem 1524, comprising a memory subsystem 1526 and a file storage subsystem 1528, user interface input devices 1522, user interface output devices 1520, and a network interface subsystem 1516. The input and output devices allow user interaction with computer system 1510.

The computer system may be a server computer, a client computer, a workstation, a mainframe, a personal computer (PC), a tablet PC, a set-top box (STB), a personal digital assistant (PDA), a cellular telephone, a smartphone, a web appliance, a rack-mounted 'blade', a kiosk, a television, a game station, a network router, switch or bridge, or any data processing machine capable of executing instructions (sequential or otherwise) that specify actions to be taken by that machine.

The computer system typically includes an operating system, such as Microsoft's Windows, Sun Microsystems's Solaris, Apple Computer's macOS, Linux, or Unix. The computer system also typically can include a Basic Input/Output System (BIOS) and processor firmware. The operating system, BIOS and firmware are used by the processor to control subsystems and interfaces connected to the processor. Typical processors compatible with these operating systems include the Pentium and Itanium from Intel, the Opteron and Athlon from Advanced Micro Devices, and the ARM processor from ARM Holdings.

Examples of the claimed embodiments are neither limited to conventional computer applications nor the programmable apparatus that run them. For example, the embodiments and/or examples of what is claimed can include an optical computer, quantum computer, analog computer, or the like. The computer system may be a multi-processor or multi-core system and may use or be implemented in a distributed or remote system. The term 'processor' here is used in the broadest sense to include a singular processor and multi-core or multi-processor arrays, including graphic processing units, digital signal processors, digital processors and combinations of these devices. Further, while only a single computer system or a single machine may be illustrated, the use of a singular form of such terms shall also signify any collection of computer systems or machines that individually or jointly execute instructions to perform any one or more of the sets of instructions discussed herein. Due to the ever-changing nature of computers and networks, the description of computer system 1510 depicted in FIG. 15A is intended only as one example for purposes of illustrating the preferred embodiments. Many other configurations of computer system 1510 are possible having more or less components than the computer system depicted in FIG. 15A.

Network interface subsystem 1516 provides an interface to outside networks, including an interface to communication network 1518, and is coupled via communication network 1518 to corresponding interface devices in other computer systems or machines. Communication network 1518 may comprise many interconnected computer systems, machines and communication links. These communication links may be wireline links, optical links, wireless links, or any other devices for communication of information. Communication network 1518 can be any suitable computer network, for example a wide area network such as the Internet, and/or a local area network such as Ethernet. The communication network can be wired and/or wireless, and the communication network can use encryption and decryption methods, such as is available with a virtual private network. The communication network uses one or more communications interfaces, which can receive data from, and transmit data to, other systems. Embodiments of communications interfaces typically include an Ethernet card, a modem (e.g., telephone, satellite, cable, or ISDN), (asynchronous) digital subscriber line (DSL) unit, Firewire interface, USB interface, and the like. One or more communications protocols can be used, such as HTTP, TCP/IP, RTP/RTSP, IPX and/or UDP.

User interface input devices 1522 may include an alphanumeric keyboard, a keypad, pointing devices such as a mouse, trackball, touchpad, stylus, or graphics tablet, a scanner, a touchscreen incorporated into the display, audio input devices such as voice recognition systems or microphones, eye-gaze recognition, brainwave pattern recognition, and other types of input devices. Such devices can be connected by wire or wirelessly to a computer system. In general, use of the term 'input device' is intended to include all possible types of devices and ways to input information into computer system 1510 or onto communication network 1518. User interface input devices typically allow a user to select objects, icons, text and the like that appear on some types of user interface output devices, for example, a display subsystem.

User interface output devices 1520 may include a display subsystem, a printer, a fax machine, or non-visual displays such as audio output devices. The display subsystem may include a cathode ray tube (CRT), a flat-panel device such as a liquid crystal display (LCD), a projection device, or some other device for creating a visible image such as a virtual reality system. The display subsystem may also provide non-visual display such as via audio output or tactile output (e.g., vibrations) devices. In general, use of the term 'output device' is intended to include all possible types of devices and ways to output information from computer system 1510 to the user or to another machine or computer system.

Memory subsystem 1526 typically includes a number of memories including a main random-access memory (RAM') 1530 (or other volatile storage device) for storage of instructions and data during program execution and a read-only memory (ROM') 1532 in which fixed instructions are stored. File storage subsystem 1528 provides persistent storage for program and data files, and may include a hard disk drive, a floppy disk drive along with associated removable media, a CD-ROM drive, an optical drive, a flash memory, or removable media cartridges. The databases and modules implementing the functionality of certain embodiments may be stored by file storage subsystem 1528.

Bus subsystem 1512 provides a device for letting the various components and subsystems of computer system 1510 communicate with each other as intended. Although bus subsystem 1512 is shown schematically as a single bus, alternative embodiments of the bus subsystem may use multiple busses. For example, RAM-based main memory can communicate directly with file storage systems using Direct Memory Access (DMA') systems.

FIG. 15B depicts a memory 1540 such as a non-transitory, computer readable data and information storage medium associated with file storage subsystem 1528, and/or with network interface subsystem 1516, and can include a data structure 1580 specifying a circuit design. The memory 1540 can be a hard disk, a floppy disk, a CD-ROM, an optical medium, removable media cartridge, or other medium that stores computer readable data in a volatile or non-volatile form. Software read into a computer from such a memory can be converted at a selected instance in time from a tangible form to a transmission signal that is propagated through a medium (such as a network, connector, wire, or trace as an electrical pulse or a medium such as space or an atmosphere as electromagnetic radiation with wavelengths in the electromagnetic spectrum longer than infrared light).

FIG. 15C signifies an integrated circuit 1590 created with the described technology that includes one or more cells selected, for example, from a cell library.

DETAILED DESCRIPTION—TECHNOLOGY SUPPORT HARDWARE/SOFTWARE EQUIVALENCE

Some of the embodiments and/or examples described herein comprise and/or use a processor. As used herein, the term 'processor' signifies a tangible data and information processing device that physically transforms data and information, typically using a sequence transformations (also referred to as "operations"). Data and information can be physically represented by an electrical, magnetic, optical or acoustical signal that is capable of being stored, accessed, transferred, combined, compared, or otherwise manipulated by the processor. The term 'processor' can signify a singular processor and multi-core systems or multi-processor arrays, including graphic processing units, digital signal processors, digital processors or combinations of these elements.

The processor can be electronic, for example, comprising digital logic circuitry (for example, binary logic), or analog (for example, an operational amplifier). The processor can also be non-electronic, for example, as seen in processors based on optical signal processing, DNA transformations or quantum mechanics, or a combination of technologies, such as an optoelectronic processor. For data and information structured in binary form, any processor that can transform the data and information using the AND, OR and NOT logical operations (and their derivatives, such as the NAND, NOR, and XOR operations) can transform the data and information using any function of Boolean logic. A processor such as an analog neural network processor can also transform data and information non-digitally. No scientific evidence exists that any of these processors are processing, storing and retrieving data and information, in any manner or form equivalent to the bioelectric structure of the human brain.

The one or more processors may also operate to support performance of the relevant operations in a 'cloud computing' environment or as a 'software as a service' (SaaS). For example, at least some of the operations may be performed by a group of processors available at a distributed or remote system, these processors accessible via a communications network (e.g., the Internet) and via one or more software interfaces (e.g., an application program interface (API).)

As used herein, the term 'module' signifies a tangible data and information processing device, that typically is limited in size and/or complexity. For example, the term 'module' can signify one or more methods or procedures that can transform data and information. The term 'module' can also signify a combination of one or more methods and procedures in a computer program. The term 'module' can also signify a small network of digital logic devices, in which interconnections of the logic devices give structure to the network. Methods and procedures comprising a module, specified in a specialized language, such as System C, can be used to generate a specification for a network of digital logic devices that process data and information with exactly the same results as are obtained from the methods and procedures.

A module can be permanently configured (e.g., hardwired to form hardware), temporarily configured (e.g., programmed with software), or a combination of the two configurations (for example, a structured ASIC). Permanently configured modules can be manufactured, for example, using Application Specific Integrated Circuits (ASICs) such as Arithmetic Logic Units (ALUs), Programmable Logic Arrays (PLAs), or Read-Only Memories (ROMs), all of which are typically configured during manufacturing. Temporarily configured modules can be manufactured, for example, using Field Programmable Gate Arrays (FPGAs—for example, sold by Xilinx or Intel's Altera), Random Access Memories (RAMs) or microprocessors. A module is configured to process data and information, typically using a sequence of transformations (also referred to as "operations") applied to the data and information (or in the case of ROMs and RAMS, transforming data and information by using the input information as an address for memory that stores output data and information), to perform aspects of the present embodiments and/or examples.

Modules that are temporarily configured need not be configured at any one instance in time. For example, a processor comprising one or more modules can have the modules configured at different times. The processor can comprise a set of one or more modules at one instance of time, and to comprise a different set of one or modules at a different instance of time. The decision to manufacture or implement a module in a permanently configured form, a temporarily configured form, or a combination of the two forms, may be driven by cost, time considerations, engineering constraints and/or specific design goals. The 'substance' of a module's processing is independent of the form in which it is manufactured or implemented.

As used herein, the term 'algorithm' signifies a process comprising a sequence or set of operations or instructions that a module can use to transform data and information to achieve a result. A module can comprise one or more algorithms. As used herein, the term 'thread' refers to a sequence of instructions that can comprise a subset of the instructions of an entire process or algorithm. A process or algorithm can be partitioned into multiple threads that can be executed in parallel.

As used herein, the term 'computer' includes at least one information processor that, for example, can perform certain operations such as (but not limited to) the AND, OR and NOT logical operations using electronic gates that can comprise transistors, with the addition of memory (for example, memory based on flip-flops using the NOT-AND or NOT-OR operation). Such a processor is said to be Turing-complete or computationally universal. A computer, whether or not it is a digital computer, typically comprises many modules.

As used herein, the term 'software' or 'program' signifies one or more algorithms and data structures that configure a processor for use in the embodiments and examples described in this specification. Such devices configurable by software include one or more computers, for example, standalone, client or server computers, or one or more hardware modules, or systems of one or more such computers or modules. As used herein, the term 'software application' signifies a set of data and instructions that configure the processor to achieve a specific result, for example, to perform word processing operations, or to encrypt a set of data.

As used herein, the term 'programming language' signifies a grammar and syntax for specifying sets of instruction and data that comprise software. Programming languages include assembler instructions, instruction-set-architecture (ISA) instructions, machine instructions, machine dependent instructions, microcode, firmware instructions, state-setting data, or either source code or object code written in any combination of one or more higher level languages, such as conventional procedural programming languages, for example, the C programming language or similar programming languages (such as SystemC), or object oriented programming language such as Smalltalk, C++ or the like, and any future equivalent programming languages.

Software is entered into, equivalently, read into, one or memories of the computer or computer system from a data and information storage device. The computer typically has a device for reading storage media that is used to transport the software or has an interface device that receives the software over a network. This process is discussed in the General Computer Explanation section.

DETAILED DESCRIPTION—TECHNOLOGY SUPPORT EMULATION ENVIRONMENT EXPLANATION

An EDA software system, such as element 1412 depicted in FIG. 14, typically includes an emulation system to verify the functionality of the circuit design. FIG. 16 depicts a typical emulation system 1600 which includes a host computer system 1603 (often part of an EDA system) and an emulator system 1602 (typically a set of programmable devices such as Field Programmable Gate Arrays (FPGAs)). The host system generates data and information, typically using a compiler 1610 that processes code written in an HDL that represents a Design Under Test (DUT) 1605, to configure the emulator to emulate a circuit design. One or more circuit designs to be emulated are referred to as a DUT. The emulator is a hardware system that emulates a DUT, for example, to use the emulation results for verifying the functionality of the DUT. One example of an emulation system that can be used for the embodiments disclosed herein is the ZeBu Server available from Synopsys, Inc.

The host system 1603 comprises one or more processors. In the embodiment where the host system is comprised of multiple processors, the functions described herein as being performed by the host system may be distributed among the multiple processors.

The host system 1603 typically includes a compiler 1610 that processes code written in a hardware description language that represents a DUT, producing data (typically binary) and information that is used to configure the emulation system 1602 to emulate the DUT. The compiler 1610 may transform, change, reconfigure, add new functions to, and/or control the timing of the DUT.

The host system and emulator exchange data and information using signals carried by an emulation connection. The connection can be one or more electrical cables, for example, cables with pin configurations compatible with the RS232 or USB protocols. The connection can be a wired communication medium or network, such as a local area network, or a wide area network such as the Internet. The connection can be a wireless communication medium or a network with one or more points of access, using a wireless protocol such as Bluetooth® or IEEE 802.11. The host system and emulator can exchange data and information through a third device, such as a network server.

The emulator includes multiple FPGAs (or other programmable devices), for example, elements $1604_1$ to $1604_N$ in FIG. 16. Each FPGA can include one or more FPGA interfaces through which the FPGA is connected to other FPGAs of the emulator (and potentially other emulator hardware components), in order for the FPGAs to exchange signals. An FPGA interface may also be referred to as an input/output pin or an FPGA pad. While some embodiments disclosed herein make use of emulators comprising FPGAs, other embodiments can include other types of logic blocks instead of, or along with, the FPGAs for emulating DUTs, for example, custom FPGAs, specialized ASICs for emulation or prototyping, memories, and input/output devices.

A programmable device may include an array of programmable logic blocks and a hierarchy of reconfigurable interconnects that allow the programmable logic blocks to be connected to each other according to the descriptions in the HDL code. Each of the programmable logic blocks can be configured to perform complex combinational functions, or logic gates, such as AND, and XOR logic blocks.

In many FPGAs, logic blocks also include memory elements, which may be latches, flip-flops or more complex blocks of memory. Depending on the length of the interconnections between different logic blocks, signals may arrive at input terminals of the logic blocks at different times.

Programmable processors $1604_1$-$1004_N$ may be placed into one or more hardware boards $1612_1$ through $1612_M$. Many of such boards may be placed into a hardware unit, e.g. $1614_1$. The boards within a unit may be connected using the backplane of the unit or any other types of connections. In addition, multiple hardware units (e.g., $1614_1$ through $1614_K$) may be connected to each other by cables or any other means to form a multi-unit system. In general, the hardware emulation or prototype system 1602 may be formed using a single board, a single unit with multiple boards, or with multiple units without departing from the teachings of the present disclosure.

For a DUT that is to be emulated, the emulator receives from the host system one or more bit files including a description of the DUT. The bit files further specify partitions of the DUT created by the host system with trace and injection logic, mappings of the partitions to the FPGAs of the emulator, and design constraints. Based on the bit files, the emulator configures the FPGAs to perform the functions of the DUT. With some emulators, one or more FPGAs of an emulator already have the trace and injection logic built into the silicon of the FPGA. For this type of emulator, the FPGAs don't have to be configured by the host system to emulate trace and injection logic.

The host system 1603 receives (e.g., from a user or from a data store) a description of a DUT that is to be emulated. In one embodiment, the DUT description is in a hardware description language (HDL), such as register transfer language (RTL). In another embodiment, the DUT description is in netlist level files, or a mix of netlist level files and HDL files. If part of the DUT description or the entire DUT description is in a HDL, the host system synthesizes the DUT description to create a gate level netlist based on the DUT description. A host system can use the netlist of the DUT to partition the DUT into multiple partitions, with some of these partitions including trace and injection logic. The trace and injection logic traces interface signals exchanged via the interfaces of an FPGA. Additionally, the trace and injection logic can be used to inject traced interface signals into the logic of the FPGA. The host system maps each partition to an FPGA of the emulator. With some emulators, the trace and injection logic is only included in select partitions for a group of FPGAs. The trace and injection logic can be built into one or more of the FPGAs of an emulator. The host system can synthesize multiplexers to be mapped into the FPGAs. The multiplexers can be used by the trace and injection logic to inject interface signals into the DUT logic.

The host system creates bit files describing each partition of the DUT and the mapping of the partitions to the FPGAs. For partitions in which trace and injection logic was incorporated, the bit files also describe the incorporation of the logic. The bit files may also include place and route information and design constraints. The host system stores the bit files and also stores for components of the DUT information describing which FPGAs are to emulate each component of the DUT (to which FPGAs each component is mapped).

Upon request, the host system transmits the bit files to the emulator. The host system instructs the emulator to emulate the DUT. During emulation of the DUT or at the end of the emulation, the host system receives emulation results from the emulator through the emulation connection. Emulation results are data and information generated by the emulator based on the emulation of the DUT. The emulation results include interface signals (states of interface signals) traced by the trace and injection logic of each FPGA. The host system can stores the emulation results, or transmit them to another processing system.

After emulation of the DUT, a user may request to debug a component of the DUT. If such a request is made the user may provide a time period of the emulation to debug. The host system identifies which FPGAs are configured to emulate the component based on the stored information. The host system retrieves stored interface signals associated with the time period and traced by the trace and injection logic of each identified FPGA. The host system instructs the emulator to re-emulate the identified FPGAs, either one by one, multiple at a time, or altogether. The host system transmits the retrieved interface signals to the emulator in order to re-emulate the component for the time period. The trace and injection logic of each identified FPGA injects its respective interface signals received from the host system into the logic of the DUT mapped to the FPGA. In case of multiple re-emulations of an FPGA, the results may be merged all together to have a full debug view.

The host system receives from the emulator signals traced by logic of the identified FPGAs during the re-emulation of the component. The host system stores the signals received from the emulator. The signals traced during the re-emulation can have a higher sampling rate than during the initial emulation. For example, in the initial run a traced signal may be comprised of a saved hardware state every X milliseconds. However, in the re-emulation the traced signal may be comprised of a saved hardware state every Y milliseconds, where Y is less than X. If the user requests to view a waveform of a signal traced during the re-emulation, the host system can retrieve the stored signal and display a plot of the signal (generates a waveform of the signal). Afterwards the user can, for example, request to re-emulate the same component but for a different time period or to re-emulate another component.

A host system typically comprises at least seven sub-systems: a design synthesizer, a mapping module, a run time module, a results module, a debug module, a waveform module, and a storage module. Each of these sub-systems may be embodied as hardware, software, firmware, or a combination thereof. Together these components configure the emulator, and monitor the emulation results.

The design synthesizer converts the HDL of a DUT into gate level logic. For a DUT that is to be emulated, the design synthesizer receives a description of the DUT. If the description of the DUT is fully or partially in HDL (e.g., RTL or other level of abstraction), the design synthesizer 1610 synthesizes the HDL of the DUT to create a gate-level netlist with a description of the DUT in terms of gate level logic.

The mapping module partitions DUTs and maps partitions to emulator FPGAs. The mapping module partitions a DUT at the gate level into a number of partitions using the netlist of the DUT. For each partition, the mapping module retrieves a gate level description of the trace and injection logic and incorporates the logic into the partition. As described above, the trace and injection logic included in a partition is configured to trace signals exchanged via the interfaces of an FPGA to which the partition is mapped (trace interface signals). The trace and injection logic can be incorporated into the DUT prior to the partitioning. For example, the trace and injection logic may be incorporated by the design synthesizer prior to or after the synthesizing the HDL of the DUT. Hence, the trace and injection logic may not match the partitions, it may be a subset, a superset or even different from the partitions.

In addition to including the trace and injection logic, the mapping module may include additional tracing logic in a partition in order to trace the states of certain DUT components that are not traced by the trace and injection logic (to trace signals other than the interface signals traced by the trace and injection logic). The mapping module may include the additional tracing logic in the DUT prior to the partitioning or in partitions after the partitioning. The design synthesizer can include the additional tracing logic in an HDL description of the DUT prior to synthesizing the description.

The mapping module maps each partition of the DUT to an FPGA of the emulator. The mapping module performs the partitioning and mapping using design rules, design constraints (e.g., timing or logic constraints), and information about the emulator. For components of the DUT, the mapping module stores information in the storage module describing which FPGAs are to emulate each component.

Based on the partitioning and the mapping, the mapping module generates one or more bit files that describe the created partitions and the mapping of logic to each FPGA of the emulator. The bit files may include additional information, such as constraints of the DUT, and routing information of connections between FPGAs and connections within each FPGA. The mapping module can generate a bit file for each partition of the DUT, which can be stored in the storage module. Upon request from a user, the mapping module transmits the bit files to the emulator, which the emulator uses to configure the FPGAs to emulate the DUT.

If the emulator includes specialized ASICs that include the trace and injection logic, the mapping module may generate a specific configuration allowing to connect them to the DUT or just save the information of what traced/injected signal is and where the information is stored on the specialized ASIC.

The run time module controls emulations performed on the emulator. The run time module may cause the emulator to start or stop executing an emulation. Additionally, the run time module may provide input signals/data to the emulator. The input signals may be provided directly to the emulator through the connection or indirectly through other input signal devices. For example, the host system with the run time module may control an input signal device to provide the input signals to the emulator. The input signal device may be, for example, a test board (directly or through cables), signal generator, another emulator, or another host system.

The results module processes emulation results generated by the emulator. During emulation and/or after completing the emulation, the results module receives emulation results from the emulator generated during the emulation. The emulation results include signals traced during the emulation. Specifically, the emulation results include interface signals traced by the trace and injection logic emulated by each FPGA. The emulation results may also include signals traced by additional logic included in the DUT. Each traced signal can span multiple cycles of the emulation. A traced signal is comprised of multiple hardware states and each hardware state is associated with a time of the emulation. The results module stores the traced signals received in the storage module. For each stored signal, the results module can store information indicating which FPGA generated the traced signal.

The debug module allows users to debug DUT components. After the emulator has emulated a DUT and the results module has received the interface signals traced by the trace and injection logic during the emulation, a user may request to debug a component of the DUT by re-emulating the component for a specific time period. In a request to debug a component, the user identifies the components and indicates a time period of the emulation to debug. The user's request can also include a sampling rate that indicates how often hardware states should be saved by logic that traces signals.

The debug module identifies the one or more FPGAs of the emulator that are configured to emulate the component based on the information stored by the mapping module in the storage module. For each identified FPGA, the debug module retrieves, from the storage module, interface signals traced by the trace and injection logic of the FPGA during the time period indicated by the user (i.e., retrieve hardware states traced by the trace and injection logic that are associated with the time period).

The debug module transmits the retrieved interface signals to the emulator. The debug module instructs the debug module to run the identified FPGAs and for the trace and injection logic of each identified FPGA to inject its respective traced signals into logic of the FPGA in order to re-emulate the component for the requested time period. The debug module can also transmit the sampling rate provided by the user to the emulator so that the tracing logic traces hardware states at the proper intervals.

To debug the component, the emulator only has to run the FPGAs to which the component has been mapped. Additionally, the re-emulation of the component does not have to start from the beginning but can start at any point desired by the user.

For an identified FPGA, the debug module can transmit instructions to the emulator to load multiple emulator FPGAs with the same configuration of the identified FPGA. The debug module additionally instructs the emulator to run the multiple FPGAs in parallel. Each FPGA from the multiple FPGAs is run with a different time window of the interface signals in order to generate a larger time window in a shorter amount of time. For example, for the identified FPGA to run a certain amount of cycles it may take an hour. However, if multiple FPGAs are loaded with the configuration of the identified FPGA and each of the FPGAs runs a subset of the cycles, it may only take a few minutes for the FPGAs to collectively run all of the cycles.

A user may identify a hierarchy or a list of DUT signals to re-emulate. To enable this, the debug module determines the FPGA needed to emulate the hierarchy or list of signals, retrieves the necessary interface signals and transmits the retrieved interface signals to the emulator for re-emulation. Hence, a user can identify any element (e.g., component or signal) of the DUT to debug/re-emulate.

The waveform module generates waveforms based on traced signals. If a user requests to view a waveform of a signal traced during an emulation run, the host system retrieves the signal from the storage module. The waveform module displays a plot of the signal to the user. For one or more signals, when the signals are received from the emulator, the waveform module can automatically generate the plots of the signals.

DETAILED DESCRIPTION—TECHNOLOGY SUPPORT EXAMPLE COMPUTER SYSTEM

Various embodiments may be implemented, for example, using one or more well-known computer systems, such as computer system 1700 shown in FIG. 17. One or more computer systems 1700 may be used, for example, to implement any of the embodiments discussed herein, as well as combinations and sub-combinations thereof.

Computer system 1700 may include one or more processors (also called central processing units, or CPUs), such as a processor 1704. Processor 1704 may be connected to a bus or communication infrastructure 1706.

Computer system 1700 may also include user input/output device(s) 1703, such as monitors, keyboards, pointing devices, etc., which may communicate with communication infrastructure 1706 through user input/output interface(s) 1702.

One or more of processors 1704 may be a graphics processing unit (GPU). In an embodiment, a GPU may be a processor that is a specialized electronic circuit designed to process mathematically intensive applications. The GPU may have a parallel structure that is efficient for parallel processing of large blocks of data, such as mathematically intensive data common to computer graphics applications, images, videos, vector processing, array processing, etc., as well as cryptography, including brute-force cracking, generating cryptographic hashes or hash sequences, solving partial hash-inversion problems, and/or producing results of other proof-of-work computations for some blockchain-based applications, for example.

Additionally, one or more of processors 1704 may include a coprocessor or other implementation of logic for accelerating cryptographic calculations or other specialized mathematical functions, including hardware-accelerated cryptographic coprocessors. Such accelerated processors may further include instruction set(s) for acceleration using coprocessors and/or other logic to facilitate such acceleration.

Computer system 1700 may also include a main or primary memory 1708, such as random access memory (RAM). Main memory 1708 may include one or more levels of cache. Main memory 1708 may have stored therein control logic (i.e., computer software) and/or data.

Computer system 1700 may also include one or more secondary storage devices or secondary memory 1710. Secondary memory 1710 may include, for example, a main storage drive 1712 and/or a removable storage device or drive 1714. Main storage drive 1712 may be a hard disk drive or solid-state drive, for example. Removable storage drive 1714 may be a floppy disk drive, a magnetic tape drive, a compact disk drive, an optical storage device, tape backup device, and/or any other storage device/drive.

Removable storage drive 1714 may interact with a removable storage unit 1718. Removable storage unit 1718 may include a computer usable or readable storage device having stored thereon computer software (control logic) and/or data. Removable storage unit 1718 may be a floppy disk, magnetic tape, compact disk, DVD, optical storage disk, and/any other computer data storage device. Removable storage drive 1714 may read from and/or write to removable storage unit 1718.

Secondary memory 1710 may include other means, devices, components, instrumentalities or other approaches for allowing computer programs and/or other instructions and/or data to be accessed by computer system 1700. Such means, devices, components, instrumentalities or other approaches may include, for example, a removable storage unit 1722 and an interface 1720. Examples of the removable storage unit 1722 and the interface 1720 may include a program cartridge and cartridge interface (such as that found in video game devices), a removable memory chip (such as an EPROM or PROM) and associated socket, a memory stick and USB port, a memory card and associated memory card slot, and/or any other removable storage unit and associated interface.

Computer system 1700 may further include a communication or network interface 1724. Communication interface 1724 may enable computer system 1700 to communicate and interact with any combination of external devices, external networks, external entities, etc. (individually and collectively referenced by reference number 1728). For example, communication interface 1724 may allow computer system 1700 to communicate with external or remote devices 1728 over communication path 1726, which may be wired and/or wireless (or a combination thereof), and which may include any combination of LANs, WANs, the Internet, etc. Control logic and/or data may be transmitted to and from computer system 1700 via communication path 1726.

Computer system 1700 may also be any of a personal digital assistant (PDA), desktop workstation, laptop or notebook computer, netbook, tablet, smart phone, smart watch or other wearable, appliance, part of the Internet of Things (IoT), and/or embedded system, to name a few non-limiting examples, or any combination thereof.

Computer system 1700 may be a client or server, accessing or hosting any applications and/or data through any delivery paradigm, including but not limited to remote or distributed cloud computing solutions; local or on-premises software (e.g., "on-premise" cloud-based solutions); "as a service" models (e.g., content as a service (CaaS), digital content as a service (DCaaS), software as a service (SaaS), managed software as a service (MSaaS), platform as a service (PaaS), desktop as a service (DaaS), framework as a service (FaaS), backend as a service (BaaS), mobile backend as a service (MBaaS), infrastructure as a service (IaaS), database as a service (DBaaS), etc.); and/or a hybrid model including any combination of the foregoing examples or other services or delivery paradigms.

Any applicable data structures, file formats, and schemas may be derived from standards including but not limited to JavaScript Object Notation (JSON), Extensible Markup Language (XML), Yet Another Markup Language (YAML), Extensible Hypertext Markup Language (XHTML), Wireless Markup Language (WML), MessagePack, XML User Interface Language (XUL), or any other functionally similar representations alone or in combination. Alternatively, proprietary data structures, formats or schemas may be used, either exclusively or in combination with known or open standards.

Any pertinent data, files, and/or databases may be stored, retrieved, accessed, and/or transmitted in human-readable formats such as numeric, textual, graphic, or multimedia formats, further including various types of markup language, among other possible formats. Alternatively or in combination with the above formats, the data, files, and/or databases may be stored, retrieved, accessed, and/or transmitted in binary, encoded, compressed, and/or encrypted formats, or any other machine-readable formats.

Interfacing or interconnection among various systems and layers may employ any number of mechanisms, such as any number of protocols, programmatic frameworks, floorplans, or application programming interfaces (API), including but not limited to Document Object Model (DOM), Discovery Service (DS), NSUserDefaults, Web Services Description Language (WSDL), Message Exchange Pattern (MEP), Web Distributed Data Exchange (WDDX), Web Hypertext Application Technology Working Group (WHATWG) HTML5 Web Messaging, Representational State Transfer (REST or RESTful web services), Extensible User Interface Protocol (XUP), Simple Object Access Protocol (SOAP), XML Schema Definition (XSD), XML Remote Procedure Call (XML-RPC), or any other mechanisms, open or proprietary, that may achieve similar functionality and results.

Such interfacing or interconnection may also make use of uniform resource identifiers (URI), which may further include uniform resource locators (URL) or uniform resource names (URN). Other forms of uniform and/or unique identifiers, locators, or names may be used, either exclusively or in combination with forms such as those set forth above.

Any of the above protocols or APIs may interface with or be implemented in any programming language, procedural, functional, or object-oriented, and may be compiled or interpreted. Non-limiting examples include C, C++, C #, Objective-C, Java, Swift, Go, Ruby, Perl, Python, JavaScript, WebAssembly, or virtually any other language, with any other libraries or schemas, in any kind of framework, runtime environment, virtual machine, interpreter, stack, engine, or similar mechanism, including but not limited to Node.js, V8, Knockout, jQuery, Dojo, Dijit, OpenUI5, AngularJS, Express.js, Backbone.js, Ember.js, DHTMLX, Vue, React, Electron, and so on, among many other non-limiting examples.

In some embodiments, a tangible, non-transitory apparatus or article of manufacture comprising a tangible, non-transitory computer useable or readable medium having control logic (software) stored thereon may also be referred to herein as a computer program product or program storage device. This includes, but is not limited to, computer system 1700, main memory 1708, secondary memory 1710, and removable storage units 1718 and 1722, as well as tangible articles of manufacture embodying any combination of the foregoing. Such control logic, when executed by one or more data processing devices (such as computer system 1700), may cause such data processing devices to operate as described herein.

Based on the teachings contained in this disclosure, it will be apparent to persons skilled in the relevant art(s) how to make and use embodiments of this disclosure using data processing devices, computer systems and/or computer architectures other than that shown in FIG. 17. In particular, embodiments may operate with software, hardware, and/or operating system implementations other than those described herein.

It is to be appreciated that the Detailed Description section, and not any other section, is intended to be used to interpret the claims. Other sections may set forth one or more but not all exemplary embodiments as contemplated by the inventor(s), and thus, are not intended to limit this disclosure or the appended claims in any way.

CONCLUSION

Based on the teachings contained in this disclosure, it may be apparent to persons skilled in the relevant art(s) how to make and use embodiments of this disclosure using data processing devices, computer systems and/or computer architectures other than that shown in FIG. 17. In particular, embodiments may operate with software, hardware, and/or operating system implementations other than those described herein.

It is to be appreciated that the Detailed Description section, and not any other section, is intended to be used to interpret the claims. Other sections may set forth one or more but not all exemplary embodiments as contemplated by the inventor(s), and thus, are not intended to limit this disclosure or the appended claims in any way. The Detailed Description and any corresponding figures may signify, only to provide knowledge and understanding. To minimize the length of the Detailed Description, while various features, structures or characteristics may be described together in a single embodiment, they also can be used in other embodiments without being written about. Variations of any of these elements, and modules, processes, machines, systems, manufactures or compositions disclosed by such embodiments and/or examples are used in commerce. The Detailed Description and any corresponding figures may signify, implicitly or explicitly, advantages and improvements of claimed embodiments for use in commerce.

While this disclosure describes exemplary embodiments for exemplary fields and applications, it should be understood that the disclosure is not limited thereto. Other embodiments and modifications thereto are possible, and are within the scope and spirit of this disclosure. For example, and without limiting the generality of this paragraph, embodiments are not limited to the software, hardware, firmware, and/or entities illustrated in the figures and/or described herein. Further, embodiments (whether or not explicitly described herein) have significant utility to fields and applications beyond the examples described herein.

Embodiments have been described herein with the aid of functional building blocks illustrating the implementation of specified functions and relationships thereof. The boundaries of these functional building blocks have been arbitrarily defined herein for the convenience of the description. Alternate boundaries may be defined as long as the specified functions and relationships (or equivalents thereof) are appropriately performed. Also, alternative embodiments may perform functional blocks, steps, operations, methods, etc. using orderings different from those described herein.

References herein to "one embodiment," "an embodiment," "an example embodiment," "some embodiments," or similar phrases, indicate that the embodiment described may include a particular feature, structure, or characteristic, but every embodiment may not necessarily include the particular feature, structure, or characteristic. Moreover, such phrases are not necessarily referring to the same embodiment.

Further, when a particular feature, structure, or characteristic is described in connection with an embodiment, it would be within the knowledge of persons skilled in the relevant art(s) to incorporate such feature, structure, or characteristic into other embodiments whether or not explicitly mentioned or described herein. Additionally, some embodiments may be described using the expression "coupled" and "connected" along with their derivatives. These terms are not necessarily intended as synonyms for each other. For example, some embodiments may be described using the terms "connected" and/or "coupled" to indicate that two or more elements are in direct physical or electrical contact with each other. The term "coupled," however, may also mean that two or more elements are not in direct contact with each other, but yet still co-operate or interact with each other.

The breadth and scope of this disclosure should not be limited by any of the above-described exemplary embodiments, but should be defined only in accordance with the following claims and their equivalents.

What is claimed:

1. A computer-implemented method of automatic test-pattern generation (ATPG) validation, comprising:
    parsing an ATPG input;
    performing semantic analysis on the ATPG input comprising a cycle-based test pattern, for a first block of the ATPG input;
    generating, by a processor, a hardware-description language (HDL) model based on the semantic analysis, wherein the HDL model represents a circuit structure that shares functional equivalence with the ATPG input based on the semantic analysis;
    creating an HDL testbench based on the HDL model, wherein the HDL testbench comprises a plurality of event-based test patterns that mimic a given automatic test equipment (ATE) behavior;
    simulating an ATE test of the circuit structure, by running the HDL testbench based on the HDL model; and
    outputting a validation result of the circuit structure, based on the simulating.

2. The computer-implemented method of claim 1, wherein the HDL model is smaller in size than the first block of the ATPG input.

3. The computer-implemented method of claim 1, further comprising generating debugging output for debugging the ATPG input.

4. The computer-implemented method of claim 1, wherein the simulating comprises running the HDL testbench in at least one execution scheme, comprising sequential execution, concurrent execution through partitions, serial access to scan cells, parallel access to the scan cells, or a combination thereof.

5. The computer-implemented method of claim 1, wherein the HDL testbench is part of a layered HDL testbench architecture, and wherein the semantic analysis is aborted in response to a failure of the parsing.

6. The computer-implemented method of claim 1, wherein the ATPG validation is performed in an HDL domain separate from an ATPG testing domain, before ATE testing of a device under test (DUT).

7. The computer-implemented method of claim 1, wherein the given ATE behavior comprises a stimulus, and wherein the stimulus corresponds to a given test pattern in the HDL testbench, wherein the given test pattern is represented in the HDL testbench only by a functional description.

8. A non-transitory computer-readable storage medium storing instructions for automatic test-pattern generation (ATPG) validation that, when executed by a computer processor, cause the computer processor to perform operations comprising:
  parse an ATPG input;
  perform semantic analysis on the ATPG input comprising a cycle-based test pattern, for a first block of the ATPG input;
  generate a hardware-description language (HDL) model based on the semantic analysis, wherein the HDL model represents a circuit structure that shares functional equivalence with the ATPG input based on the semantic analysis;
  create an HDL testbench based on the HDL model, wherein the HDL testbench comprises a plurality of event-based test patterns that mimic a given automatic test equipment (ATE) behavior;
  simulate an ATE test of the circuit structure, by running the HDL testbench based on the HDL model; and
  output a validation result of the circuit structure, based on the simulating.

9. The non-transitory computer-readable storage medium of claim 8, wherein the HDL model is smaller in size than the first block of the ATPG input.

10. The non-transitory computer-readable storage medium of claim 8, the operations further comprising:
  generate debugging output for debugging the ATPG input.

11. The non-transitory computer-readable storage medium of claim 8, wherein the simulating comprises running the HDL testbench in at least one execution scheme, comprising sequential execution, concurrent execution through partitions, serial access to scan cells, parallel access to the scan cells, or a combination thereof.

12. The non-transitory computer-readable storage medium of claim 8, wherein the HDL testbench is part of a layered HDL testbench architecture, and wherein the semantic analysis is aborted in response to a failure of the parsing.

13. The non-transitory computer-readable storage medium of claim 8, wherein the ATPG validation is performed in an HDL domain separate from an ATPG testing domain, before ATE testing of a device under test (DUT).

14. A system for automatic test-pattern generation (ATPG) validation, comprising:
  a memory; and
  at least one computer processor connected to the memory and configured at least to:
    parse an ATPG input;
    perform semantic analysis on the ATPG input comprising a cycle-based test pattern, for a first block of the ATPG input;
    generate a hardware-description language (HDL) model based on the semantic analysis, wherein the HDL model represents a circuit structure that shares functional equivalence with the ATPG input based on the semantic analysis;
    create an HDL testbench based on the HDL model, wherein the HDL testbench comprises a plurality of event-based test patterns that mimic a given automatic test equipment (ATE) behavior;
    simulate an ATE test of the circuit structure, by running the HDL testbench based on the HDL model; and
    output a validation result of the circuit structure, based on the simulating.

15. The system of claim 14, wherein the HDL model is smaller in size than the first block of the ATPG input.

16. The system of claim 14, wherein the at least one computer processor is further configured to generate debugging output for debugging the ATPG input.

17. The system of claim 14, wherein to simulate the ATE test the at least one computer processor is further configured to run the HDL testbench in at least one execution scheme, comprising sequential execution, concurrent execution through partitions, serial access to scan cells, parallel access to the scan cells, or a combination thereof.

18. The system of claim 14, wherein the HDL testbench is part of a layered HDL testbench architecture, and wherein the semantic analysis is aborted in response to a failure of the parsing.

19. The system of claim 14, wherein the ATPG validation is performed in an HDL domain separate from an ATPG testing domain, before ATE testing of a device under test (DUT).

20. The system of claim 14, wherein the given ATE behavior comprises a stimulus, and wherein the stimulus corresponds to a given test pattern in the HDL testbench, wherein the given test pattern is represented in the HDL testbench only by a functional description.

* * * * *